(12) United States Patent
Seo et al.

(10) Patent No.: US 10,908,746 B2
(45) Date of Patent: Feb. 2, 2021

(54) WINDOW FOR DISPLAY DEVICE WITH IMPROVED IMPACT RESISTANCE, METHOD FOR FABRICATING THE SAME AND DISPLAY DEVICE INCLUDING THE SAME

(71) Applicant: SAMSUNG DISPLAY CO., LTD., Yongin-si (KR)

(72) Inventors: Hyunseung Seo, Anyang-si (KR); Jonghwan Cho, Ansan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 16 days.

(21) Appl. No.: 16/123,378

(22) Filed: Sep. 6, 2018

(65) Prior Publication Data
US 2019/0138127 A1   May 9, 2019

(30) Foreign Application Priority Data

Nov. 8, 2017 (KR) .......... 10-2017-0147980

(51) Int. Cl.
*G06F 3/044* (2006.01)
*G06F 3/041* (2006.01)
(Continued)

(52) U.S. Cl.
CPC ........ *G06F 3/044* (2013.01); *B29D 11/00788* (2013.01); *B32B 27/08* (2013.01);
(Continued)

(58) Field of Classification Search
CPC ............... G06F 3/041; G06F 3/044; G06F 2203/04105; G06F 2203/04102; G06F 2203/04103; B32B 27/286; B32B 27/281; B32B 27/365; B32B 27/308; B32B 27/08; G02F 2201/503; G02F 2201/133331; G02F 2201/133394; G02B 1/14; G02B 1/116; G02B 1/115; G02B 1/10
See application file for complete search history.

(56) References Cited

U.S. PATENT DOCUMENTS 9,341,749 B2      5/2016  Hongo et al.
2007/0275171 A1*  11/2007 Dang .................. G02B 1/14
                                              427/384

(Continued)

FOREIGN PATENT DOCUMENTS

KR   1020110037622 A    4/2011
KR      101168073 B1    7/2012

(Continued)

OTHER PUBLICATIONS

Partial European Search Report for Application No. 18204801.7 dated Jan. 17, 2019.

(Continued)

*Primary Examiner* — Ryan A Lubit
(74) *Attorney, Agent, or Firm* — Cantor Colburn LLP

(57) ABSTRACT

A window for a display device includes: a base layer; a first hard coating layer on the base layer; and a second hard coating layer on the first hard coating layer and having a thickness less than a thickness of the first hard coating layer, where the first hard coating layer is between the base layer and the second hard coating layer.

30 Claims, 13 Drawing Sheets

(51) Int. Cl.
    *H05K 5/00*    (2006.01)
    *H05K 5/03*    (2006.01)
    *G02B 1/10*    (2015.01)
    *G02B 1/115*   (2015.01)
    *G02B 1/116*   (2015.01)
    *G02B 1/14*    (2015.01)
    *H04M 1/02*    (2006.01)
    *B32B 27/08*   (2006.01)
    *B32B 27/28*   (2006.01)
    *B32B 27/30*   (2006.01)
    *B32B 27/36*   (2006.01)
    *B29D 11/00*   (2006.01)
    *G02F 1/1333*  (2006.01)
    *B05D 7/00*    (2006.01)

(52) U.S. Cl.
    CPC .......... *B32B 27/281* (2013.01); *B32B 27/286* (2013.01); *B32B 27/308* (2013.01); *B32B 27/36* (2013.01); *B32B 27/365* (2013.01); *G02B 1/10* (2013.01); *G02B 1/115* (2013.01); *G02B 1/116* (2013.01); *G02B 1/14* (2015.01); *G02F 1/133308* (2013.01); *G06F 3/041* (2013.01); *H04M 1/0266* (2013.01); *H05K 5/0017* (2013.01); *H05K 5/03* (2013.01); *B05D 7/546* (2013.01); *B29D 11/0073* (2013.01); *B32B 2255/10* (2013.01); *G02F 1/13338* (2013.01); *G02F 2001/133311* (2013.01); *G02F 2001/133331* (2013.01); *G02F 2001/133388* (2013.01); *G02F 2001/133394* (2013.01); *G02F 2201/503* (2013.01); *G02F 2201/54* (2013.01); *G06F 2203/04102* (2013.01); *G06F 2203/04103* (2013.01); *G06F 2203/04105* (2013.01)

(56) References Cited

U.S. PATENT DOCUMENTS

| | | | | |
|---|---|---|---|---|
| 2010/0208350 | A1* | 8/2010 | Yoshihara | G02B 1/116 359/585 |
| 2011/0057899 | A1* | 3/2011 | Sleeman | H03K 17/975 345/174 |
| 2011/0175845 | A1* | 7/2011 | Honda | G06F 3/0447 345/174 |
| 2013/0130002 | A1 | 5/2013 | Lee et al. | |
| 2013/0147739 | A1* | 6/2013 | berg | G06F 3/0416 345/173 |
| 2013/0164493 | A1 | 6/2013 | Hirai | |
| 2015/0370376 | A1* | 12/2015 | Harley | G06F 3/0414 345/174 |
| 2016/0040027 | A1 | 2/2016 | Woo et al. | |
| 2016/0185926 | A1 | 6/2016 | Song et al. | |
| 2016/0320803 | A1 | 11/2016 | Oh et al. | |
| 2016/0342257 | A1* | 11/2016 | Watazu | G01L 1/146 |
| 2017/0012225 | A1 | 1/2017 | Heo et al. | |
| 2017/0090618 | A1 | 3/2017 | Qiao et al. | |
| 2017/0106636 | A1 | 4/2017 | Jo et al. | |
| 2017/0174938 | A1 | 6/2017 | Shin et al. | |
| 2017/0242506 | A1* | 8/2017 | Patel | G06F 3/041 |
| 2017/0276840 | A1* | 9/2017 | Horio | B32B 27/281 |
| 2017/0324059 | A1 | 11/2017 | Choi et al. | |
| 2018/0003860 | A1* | 1/2018 | Cho | G02B 1/14 |

FOREIGN PATENT DOCUMENTS

| | | |
|---|---|---|
| KR | 1020130055311 A | 5/2013 |
| KR | 1020130071941 A | 7/2013 |
| KR | 1020140121176 A | 10/2014 |
| KR | 1020160079549 A | 7/2016 |
| KR | 1020160130074 A | 11/2016 |
| KR | 1020170005957 A | 1/2017 |
| KR | 1020170043885 A | 4/2017 |
| KR | 101737155 B1 | 5/2017 |
| KR | 101748009 B1 | 6/2017 |
| KR | 1020170088293 A | 8/2017 |

OTHER PUBLICATIONS

Extended European Search Report for Application No. 18204801.7 dated May 6, 2019.

* cited by examiner

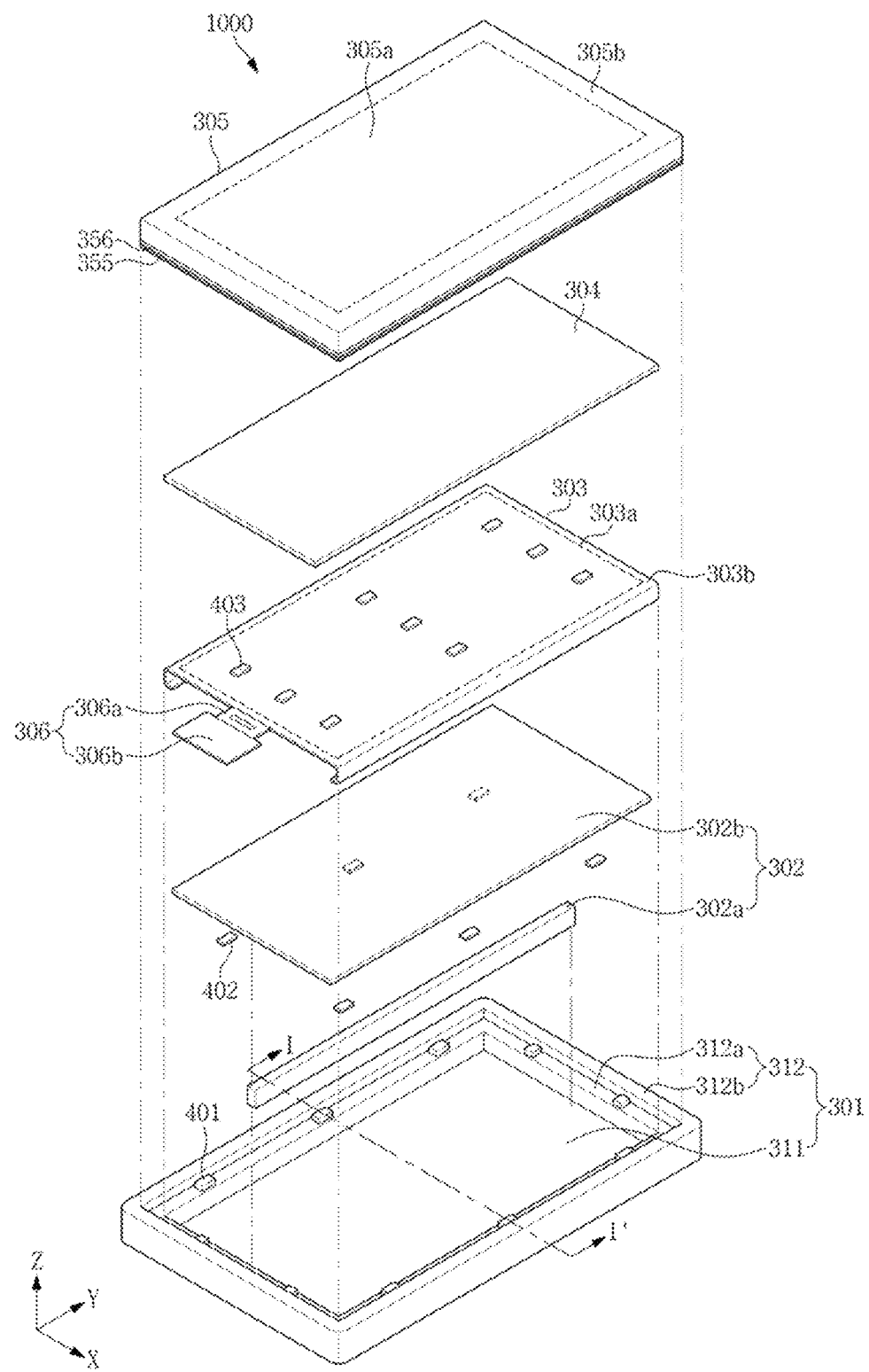

FIG. 16
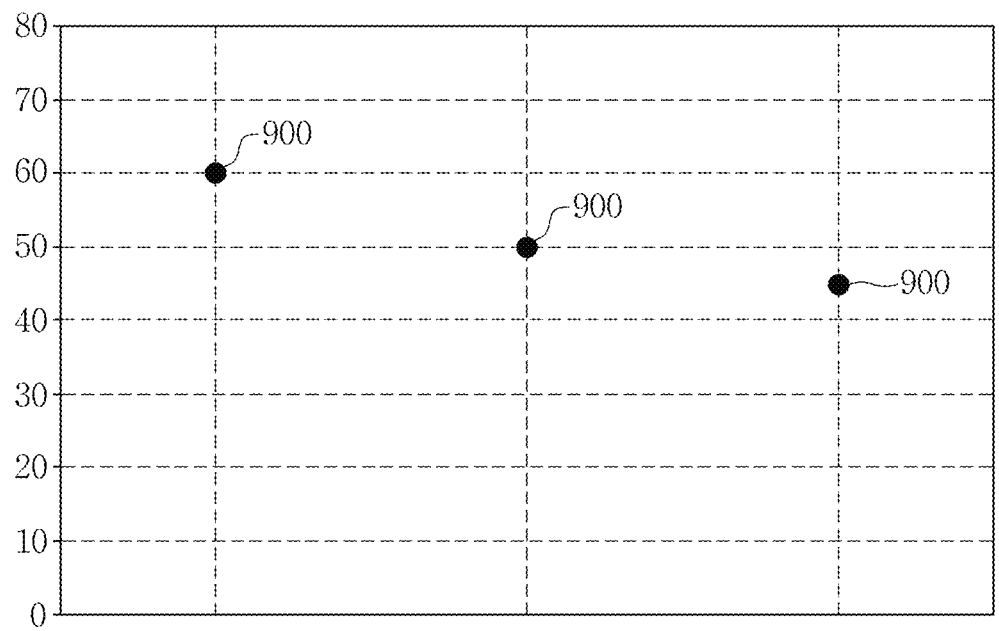
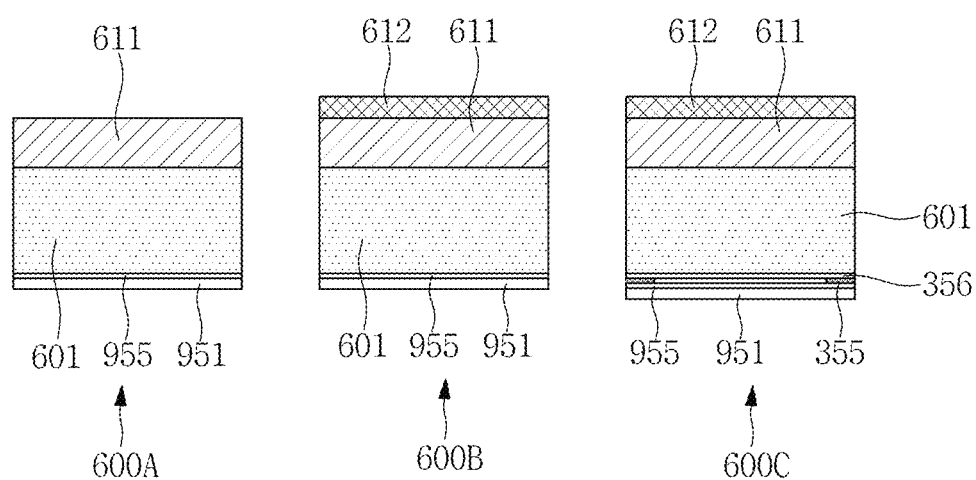

WINDOW FOR DISPLAY DEVICE WITH IMPROVED IMPACT RESISTANCE, METHOD FOR FABRICATING THE SAME AND DISPLAY DEVICE INCLUDING THE SAME

This application claims priority to Korean Patent Application No. 10-2017-0147980, filed on Nov. 8, 2017, and all the benefits accruing therefrom under 35 U.S.C. § 119, the content of which in its entirety is herein incorporated by reference.

BACKGROUND

1. Field

Embodiments of the invention relate to a window for a display device, more particularly, a window for a display device with improved impact resistance, to a method for manufacturing the window and to a display device including the window.

2. Discussion of Related Art

With the recent development of mobile devices such as smart phones and tablet personal computers, a thinner and slimmer base member for a display device have been desired.

Glass or tempered glass having high mechanical properties is generally used as a front window or a front protective member of mobile devices. However, the glass itself may increase the weight of the mobile device due to its heavy weight and is also vulnerable to an external impact.

Plastic materials are being studied as a substitute for glass. Plastic materials are light in weight and less susceptible to breakage and thus are widely used as window materials for mobile devices.

SUMMARY

In a case where a display device including a window formed of a plastic material is attached to a vehicle, the impact resistance characteristic of the window of the display device is desired to be improved.

Embodiments of the invention are directed to a window for a display device with improved impact resistance, a method for manufacturing the window and a display device including the window.

According to an exemplary embodiment, a window for a display device includes: a base layer; a first hard coating layer on the base layer; and a second hard coating layer on the first hard coating layer and having a thickness less than a thickness of the first hard coating layer, where the first hard coating layer is between the base layer and the second hard coating layer.

In an exemplary embodiment, the second hard coating layer may have a thickness which is about 10% of the thickness of the first hard coating layer.

In an exemplary embodiment, the first hard coating layer may have a thickness in a range from about 5% to about 10% of a thickness of the base layer.

In an exemplary embodiment, the window for the display device may further include at least one of: a first auxiliary layer on a lower surface of the base layer; and a second auxiliary layer between the base layer and the first hard coating layer.

In an exemplary embodiment, at least one of the first auxiliary layer and the second auxiliary layer may include at least one of polyimide, polycarbonate, polyethersulfone, polyethylene naphthalate, polyphenylene sulfide, opaque liquid crystal polymer and polymethylmethacrylate.

In an exemplary embodiment, the first hard coating layer may include an organic material and an inorganic material.

In an exemplary embodiment, the organic material of the first hard coating layer may include acryl and epoxy.

In an exemplary embodiment, the second hard coating layer may include acrylic oligomer.

In an exemplary embodiment, at least one of the base layer, the first hard coating layer and the second hard coating layer may include fluorine.

In an exemplary embodiment, the base layer may include one of polycarbonate, a low birefringence resin and poly methyl methacrylate.

In an exemplary embodiment, the first hard coating layer may have a multilayer structure.

In an exemplary embodiment, the base layer may include a soft layer and a hard layer.

In an exemplary embodiment, the soft layer and the hard layer may be alternately arranged.

According to an exemplary embodiment, a display device includes: a display panel; and a window on the display panel. In such an embodiment, the window includes: a base layer on the display panel; a first hard coating layer on the base layer; and a second hard coating layer on the first hard coating layer and having a thickness less than a thickness of the first hard coating layer, where the first hard coating layer is between the base layer and the second hard coating layer.

In an exemplary embodiment, the second hard coating layer may have a thickness which is about 10% of the thickness of the first hard coating layer.

In an exemplary embodiment, the first hard coating layer may have a thickness in a range from about 5% to about 10% of a thickness of the base layer.

In an exemplary embodiment, the window may further include at least one of: a first auxiliary layer between the display panel and the base layer; and a second auxiliary layer between the base layer and the first hard coating layer.

In an exemplary embodiment, at least one of the first auxiliary layer and the second auxiliary layer may include at least one of polyimide, polycarbonate, polyethersulfone, polyethylene naphthalate, polyphenylene sulfide, opaque liquid crystal polymer and polymethylmethacrylate.

In an exemplary embodiment, the first hard coating layer may include an organic material and an inorganic material.

In an exemplary embodiment, the organic material of the first hard coating layer may include acryl and epoxy.

In an exemplary embodiment, the second hard coating layer may include acrylic oligomer.

In an exemplary embodiment, at least one of the base layer, the first hard coating layer and the second hard coating layer may include fluorine.

In an exemplary embodiment, the display device may further include: a frame which supports the window; a panel support portion between the window and a base portion of the frame; and a first pressure sensing portion between the panel support portion and the display panel.

In an exemplary embodiment, the display panel may include: a center portion between the panel support portion and the window; and an edge portion between the panel support portion and the base portion of the frame. The first pressure sensing portion may be disposed between the edge portion and the panel support portion.

In an exemplary embodiment, the display panel may further include at least one of: a second pressure sensing portion between a side portion protruding from an edge of the frame and an edge of the window; and a third pressure sensing portion between the window and the display panel, where the display panel is flexible.

In an exemplary embodiment, at least two of the first, second and third pressure sensing portions may have different sensitivities from each other.

In an exemplary embodiment, the third pressure sensing portion may have a lowest sensitivity, the second pressure sensing portion may have a highest sensitivity, and the first pressure sensing portion may have a sensitivity lower than the sensitivity of the second pressure sensing portion and higher than the sensitivity of the third pressure sensing portion.

In an exemplary embodiment, at least two of the first, second and third pressure sensing portions may include elastic elements having different moduli.

In an exemplary embodiment, each of the first pressure sensing portion, the second pressure sensing portion and the third pressure sensing portion may include an elastic element, a modulus of the elastic element of the third pressure sensing portion is greater than a modulus of the elastic element of the first pressure sensing portion and the modulus of the elastic element of the first pressure sensing portion is greater than a modulus of the elastic element of the second pressure sensing portion.

In an exemplary embodiment, the elastic element of the first pressure sensing portion may have a thickness substantially equal to or greater than a thickness of the elastic element of the second pressure sensing portion, and the elastic element of the third pressure sensing portion may have a thickness less than a thickness of the elastic element of the first pressure sensing portion.

According to an exemplary embodiment, a method of manufacturing a window for a display device includes: providing a first hard coating layer on a base layer; and providing a second hard coating layer on the first hard coating layer, where the second hard coating layer has a thickness less than a thickness of the first hard coating layer.

In an exemplary embodiment, the second hard coating layer may have a thickness which is about 10% of a thickness of the first hard coating layer.

In an exemplary embodiment, the first hard coating layer may have a thickness which is in a range from about 5% to about 10% of a thickness of the base layer.

In an exemplary embodiment, the method may further include at least one of:
providing a first auxiliary layer on a lower surface of the base layer; and providing a second auxiliary layer between the base layer and the first hard coating layer.

In an exemplary embodiment, at least one of the first auxiliary layer and the second auxiliary layer may include at least one of polyimide, polycarbonate, polyethersulfone, polyethylene naphthalate, polyphenylene sulfide, and opaque liquid crystal polymer.

In an exemplary embodiment, the providing the first hard coating layer may include: forming a first layer on the base layer; half-curing the first layer; forming a second layer on the half-cured first layer; and fully curing the first layer and the second layer.

BRIEF DESCRIPTION OF THE DRAWINGS

The above and other features of the invention will become more apparent by describing in detail exemplary embodiments thereof with reference to the accompanying drawings, in which:

FIG. 10 is an exploded perspective view illustrating a display device according to an exemplary embodiment;

FIG. 16 is a view for showing an impact resistance test of a window.

DETAILED DESCRIPTION

Figure 1:
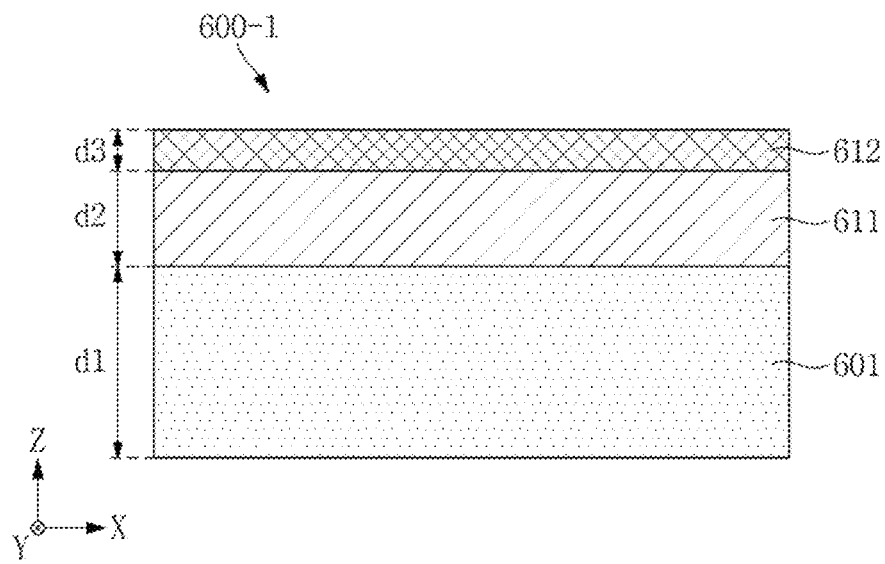
FIG. 1 is a cross-sectional view illustrating a window for a display device according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be therebetween. Conversely, when a layer, area, or plate is referred to as being "directly below" another layer, area, or plate, intervening layers, areas, or plates may be absent therebetween.

The spatially relative terms "below", "beneath", "lower", "above", "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a window for a display device, a method for manufacturing the window and a display device including the window will be described in detail with the accompanying drawings.

FIG. 1 is a cross-sectional view illustrating a window for a display device according to an exemplary embodiment.

An exemplary embodiment of a window 600-1 for a display device may include a base layer 601, a first hard coating layer 611 disposed on the base layer 601, and a second hard coating layer 612 disposed on the first hard coating layer 611, as illustrated in FIG. 1.

In an exemplary embodiment, the hard coating layers 611 and 612 are disposed upwardly of the base layer 601 and not downwardly of the base layer 601. In such an embodiment, the first hard coating layer 611 and the second hard coating layer 612 are disposed in an outer side direction of the display device with respect to the base layer 601. In such an embodiment, the window 600-1 may have high impact resistance.

The second hard coating layer 612 defines an outermost portion of the window 600-1 to be exposed to the outside of the display device. Accordingly, an impact from the outside is firstly applied to the second hard coating layer 612.

The second hard coating layer 612 at the outermost portion of the window 600-1 is subjected to a compressive stress due to the impact.

The first hard coating layer 611 adjacent to the second hard coating layer 612 is also subjected to a compressive stress due to the impact.

The first and second hard coating layers 611 and 612 may be weak to tensile stress, but are relatively strong to compressive stress.

In an exemplary embodiment, since the hard coating layers 611 and 612 included in the window 600-1 are located in an outer side direction of the display device with respect to the base layer 601, the hard coating layers 611 and 612 are subjected to a compressive stress against an external impact. Accordingly, in such an embodiment, impact resistance of the window 600-1 may be improved.

If a window has a structure in which the first hard coating layer 611 is located below the base layer 601, or the base layer 601 is positioned between the first hard coating layer 611 and the second hard coating layer 612, the above-described compressive stress is applied to the second hard coating layer 612, while a tensile stress is applied to the first hard coating layer 611 located below the base layer 601 when an impact is applied to the second hard coating layer 612 located at an outermost portion. Accordingly, in the window having such a structure, the first hard coating layer 611 may be relatively easily damaged.

In an exemplary embodiment, the base layer 601 may include an organic material, e.g., a plastic, having light transmittance. In one exemplary embodiment, for example, the base layer 601 may include at least one of polyethylene ("PET"), polypropylene ("PP"), polyamide ("PA"), polyacetal ("POM"), polymethylmethacrylate ("PMMA"), polybutylene terephthalate, polycarbonate ("PC"), polycarbonate blend series, cellulose, moisture-proof cellophane and a low refractive index resin. The materials listed above are all light transmitting materials. In such an embodiment, the aforementioned low refractive index resin may not include bisphenol A. In an exemplary embodiment, the base layer 601 may include a well-known light transmitting plastic material other than the above-listed materials.

The first hard coating layer 611 may be disposed on the base layer 601. In one exemplary embodiment, for example, the first hard coating layer 611 may be disposed between the base layer 601 and the second hard coating layer 612.

The first hard coating layer 611 may include an organic material and an inorganic material. The first hard coating layer 611 including both the organic material and the inorganic material may have a great hardness. In one exemplary embodiment, for example, the first hard coating layer 611 may have a (pencil) hardness of about 9 H.

In an exemplary embodiment, the organic material included in the first hard coating layer 611 may include acryl or epoxy, for example.

In such an embodiment, acryl increases the bonding force and density of the first hard coating layer 611, and epoxy increases the heat resistance, chemical resistance, water resistance, adhesiveness and mechanical hardness of the first hard coating layer 611.

The first hard coating layer 611 may be manufactured by curing (e.g., ultraviolet curing or thermal curing) of materials including an inorganic material, acryl and epoxy. In such a curing process, acryl shrinks while epoxy expands.

A degree of warping (or curling) of the first hard coating layer 611 may be controlled according to a combination ratio of acryl and epoxy. Accordingly, the warpage (or curling) of the first hard coating layer 611 may be substantially prevented by combination of acryl and epoxy at an appropriate ratio. In one exemplary embodiment, for example, the ratio between acryl and epoxy that may substantially prevent warpage of the first hard coating layer 611 may be about 7:3.

The second hard coating layer 612 may be disposed on the first hard coating layer 611.

The second hard coating layer 612 may include acrylic oligomer.

The second hard coating layer 612 may have a hardness substantially equal to or different from a hardness of the first hard coating layer 611. The second hard coating layer 612 may a hardness greater than or less than a hardness of the first hard coating layer 611.

In an exemplary embodiment, at least one of the base layer 601, the first hard coating layer 611 and the second hard coating layer 612 may further include fluorine. Fluorine acts as a trace additive. In such an embodiment, the hardness and anti-fingerprint characteristics of a layer may be improved by adding fluorine to the layer.

In an exemplary embodiment, the aforementioned fluorine may be selectively added, for example, only to the second hard coating layer 612 located at an outermost portion with respect to the base layer 601. In such an embodiment, the content of the fluorine in the second hard coating layer 612 may be in a range from about 0.001 weight percent (wt %) to about 0.2 wt % based on the total weight of the second hard coating layer 612.

A surface of the second hard coating layer 612 including fluorine is hydrophobic. In such an embodiment, a contact angle (or a water contact angle) of the surface of the second hard coating layer 612 may be about 105 degrees or more.

In an exemplary embodiment where fluorine is added to the first hard coating layer 611, the content of the fluorine in the first hard coating layer 611 may be in a range from about 0.001 wt % to about 0.2 wt % based on the total weight of the first hard coating layer 611.

In an exemplary embodiment where fluorine is added to the base layer 601, the content of the fluorine in the base layer 601 may be in a range from about 0.001 wt % to about 0.2 wt % based on the total weight of the base layer 601.

In an exemplary embodiment, Teflon® may be used instead of the aforementioned fluorine.

In an exemplary embodiment, at least two of the base layer 601, the first hard coating layer 611 and the second hard coating layer 612 may have a substantially equal thickness as each other.

A thickness d1 of the base layer 601 is a size of the base layer 601 measured in a Z-axis direction (i.e., a thickness direction of the window), a thickness d2 of the first hard coating layer 611 is a size of the first hard coating layer 611 measured in the Z-axis direction, and a thickness d3 of the second hard coating layer 612 is a size of the second hard coating layer 612 measured in the Z-axis direction.

In an exemplary embodiment, at least two of the base layer 601, the first hard coating layer 611 and the second hard coating layer 612 may have different thicknesses from each other. In an exemplary embodiment, the thickness d2 of the first hard coating layer 611 may be less than the thickness d1 of the base layer 601, and the thickness d3 of the second hard coating layer 612 may be less than the thickness d2 of the first hard coating layer 611. In one exemplary embodiment, for example, the thickness d2 of the first hard coating layer 611 may be in a range from about 5% to about 15% of the thickness d1 of the base layer 601, and the thickness d3 of the second hard coating layer 612 may be about 10% of the thickness d2 of the first hard coating layer 611. In one exemplary embodiment, for example, the thickness d3 of the second hard coating layer 612 may be in a range from about 0.5% to about 1.5% of the thickness d1 of the base layer 601.

The base layer 601 may have a thickness d1 in a range, for example, from about 500 micrometers (μm) to about 1,000 μm.

In an exemplary embodiment, the second hard coating layer 612, which is located at an outermost portion, may be subjected to a surface modification to improve the corrosion resistance and fingerprint resistance of the second hard coating layer 612. Accordingly, the second hard coating layer 612 has a thickness less than that of other layers.

Although including acrylic oligomer, the second hard coating layer 612 does not include epoxy which has properties (i.e., expansion properties) opposite to properties of the acrylic material. However, warping of the second hard coating layer 612 may be substantially prevented by epoxy included in the first hard coating layer 611 which is adjacent to the second hard coating layer 612.

In an exemplary embodiment, the second hard coating layer 612 may further include epoxy.

The window 600-1 of FIG. 1 may be manufactured by the following method.

In such a method, a material for the first hard coating layer 611 is applied on the base layer 601.

Thereafter, the first hard coating layer 611 is cured by heat or ultraviolet rays.

Next, a material for the second hard coating layer 612 is applied on the cured first hard coating layer 611.

Then, the second hard coating layer 612 is cured by heat or ultraviolet rays.

Figure 2:
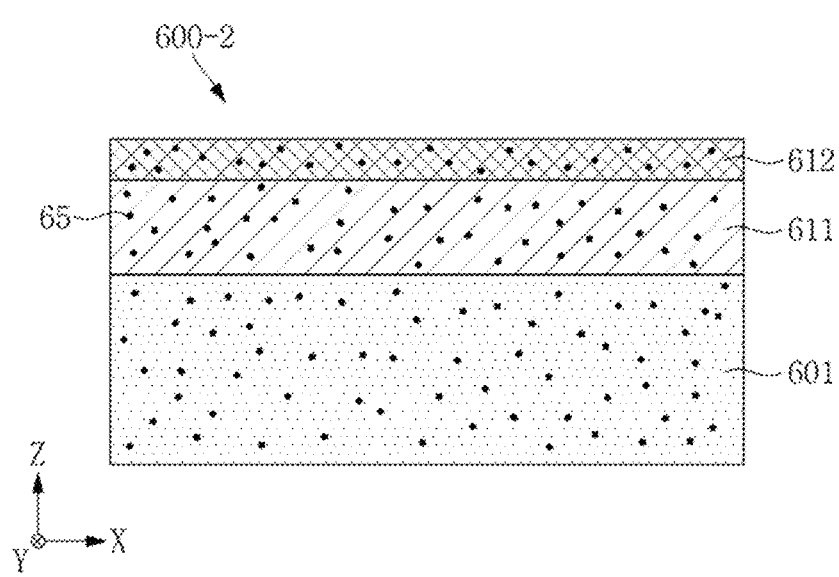
FIG. 2 is a cross-sectional view illustrating a window for a display device according to an alternative exemplary embodiment.

FIG. 2 is a cross-sectional view illustrating a window for a display device according to an alternative exemplary embodiment.

An exemplary embodiment of a window 600-2 for a display device may include a base layer 601, a first hard coating layer 611, a second hard coating layer 612 and an ultraviolet blocking element 65, as illustrated in FIG. 2.

In such an embodiment, at least one of the base layer 601, the first hard coating layer 611 and the second hard coating layer 612 may include the ultraviolet blocking element 65 disposed therein. The ultraviolet blocking element 65 serves as a trace additive. The ultraviolet blocking element 65 may effectively prevent ultraviolet rays from the outside from being incident onto the display device.

In an exemplary embodiment, the ultraviolet blocking element 65 may be selectively included in at least one of the base layer 601, the first hard coating layer 611 and the second hard coating layer 612, for example, only in the second hard coating layer 612 which is located at an outermost portion with respect to the base layer 601 such that the manufacturing cost of the window 600-2 may be reduced.

In an alternative exemplary embodiment, where the second hard coating layer 612 does not have a sufficiently large thickness, the ultraviolet blocking element 65 may be selectively added, for example, only to the first hard coating layer 611 which has a thickness larger than a thickness of the second hard coating layer 612 and is located most adjacent to an outermost layer (e.g., the second hard coating layer 612). In such an embodiment, where the thickness of the second hard coating layer 612 is small, the ultraviolet blocking element 65 may not be added to the second hard coating layer 612 in a sufficient amount, and thus the ultraviolet blocking element 65 may be added only to the first hard coating layer 611 which has a thickness larger than a thickness of the second hard coating layer 612. In such an embodiment, the ultraviolet blocking element 65 may be selectively added only to the first hard coating layer 611 rather than the second hard coating layer 612.

The base layer 601, the first hard coating layer 611 and the second hard coating layer 612 have a light transmittance of about 90% or greater. In an exemplary embodiment, the ultraviolet blocking element 65 may be added to one layer of the window 600-2 in an amount determined not to lower a critical light transmittance (for example, a light transmittance of about 90%) of the one layer. In one exemplary embodiment, for example, the content of the ultraviolet blocking element 65 in the base layer 601 may be in a range of about 3 wt % or less with respect to the total weight of the base layer 601, the content of the ultraviolet blocking element 65 in the first hard coating layer 611 may be in a range of about 3 wt % or less with respect to the total weight of the first hard coating layer 611, or the content of the ultraviolet blocking element 65 in the second hard coating layer 612 may be in a range of about 3 wt % or less with respect to the total weight of the second hard coating layer 612.

The base layer 601, the first hard coating layer 611 and the second hard coating layer 612 of FIG. 2 are substantially identical to the base layer 601, the first hard coating layer 611 and the second hard coating layer 612 described above with reference to FIG. 1.

In an exemplary embodiment, the base layer 601 may have a multilayer structure including at least two layers having different hardnesses from each other. The at least two layers may be alternately stacked one on another or disposed alternately with each other along a Z-axis direction. Such an embodiment will hereinafter be described in greater detail with reference to FIGS. 3, 4 and 5.

Figure 3:
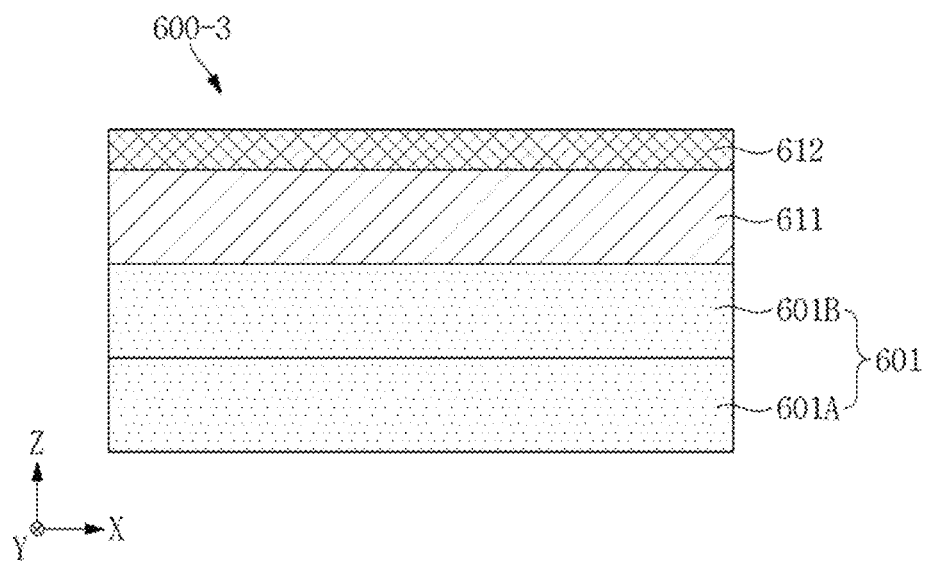
FIG. 3 is a cross-sectional view illustrating a window for a display device according to another alternative exemplary embodiment.

FIG. 3 is a cross-sectional view illustrating a window for a display device according to another alternative exemplary embodiment.

In an exemplary embodiment, a window 600-3 for a display device may include a base layer 601, a first hard coating layer 611 and a second hard coating layer 612, as illustrated in FIG. 3. In such an embodiment, the base layer 601 may include a soft layer 601A and a hard layer 601B arranged in the Z-axis direction.

In an exemplary embodiment, as shown in FIG. 3, the hard layer 601B may be disposed on the soft layer 601A. In such an embodiment, the hard layer 601B may be positioned between the soft layer 601A and the first hard coating layer 611.

In an exemplary embodiment, the soft layer 601A and the hard layer 601B may have a substantially same thickness as each other.

In an alternative exemplary embodiment, the soft layer 601A and the hard layer 601B may have different thicknesses from each other. In one exemplary embodiment, for example, the hard layer 601B may have a thickness greater than a thickness of the soft layer 601A.

In an exemplary embodiment, the soft layer 601A and the hard layer 601B may have different hardnesses from each other. In one exemplary embodiment, for example, the hard layer 601B may have a hardness greater than a hardness of the soft layer 601A.

In an exemplary embodiment, the soft layer 601A may include, for example, PC.

In an exemplary embodiment, the hard layer 601B may include, for example, PMMA. Alternatively, the hard layer 601B may include PMMA and PC.

The first hard coating layer 611 and the second hard coating layer 612 of FIG. 3 are substantially identical to the first hard coating layer 611 and the second hard coating layer 612 described above with reference to FIG. 1.

The base layer 601 of FIG. 3 may have a thickness substantially equal to a thickness of the base layer 601 of FIG. 1.

Figure 4:
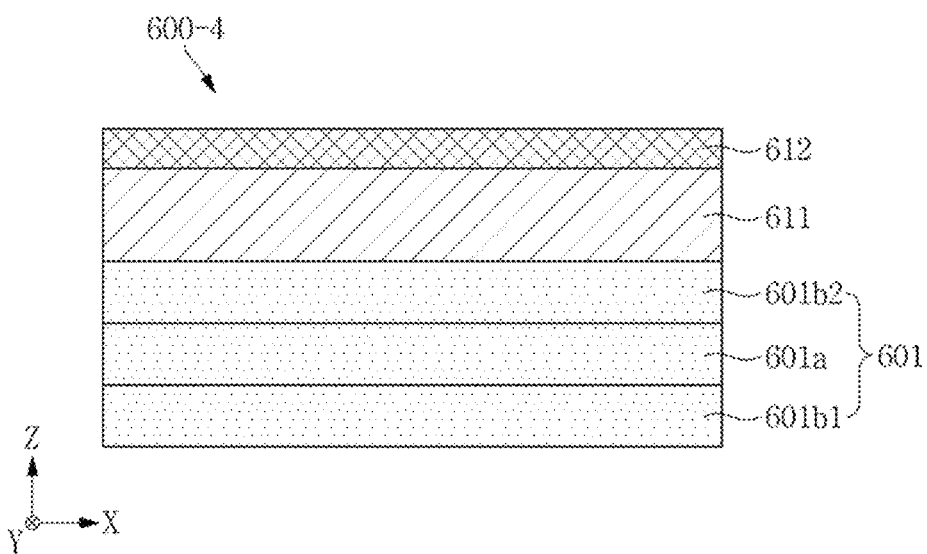
FIG. 4 is a cross-sectional view illustrating a window for a display device according to another alternative exemplary embodiment.

FIG. 4 is a cross-sectional view illustrating a window for a display device according to another alternative exemplary embodiment.

An exemplary embodiment of a window 600-4 for a display device may include a base layer 601, a first hard coating layer 611 and a second hard coating layer 612, as illustrated in FIG. 4. In such an embodiment, the base layer 601 may include a first hard layer 601*b*1, a soft layer 601*a* and a second hard layer 601*b*2 arranged in the Z-axis direction.

In an exemplary embodiment, as shown in FIG. 4, the soft layer 601*a* may be disposed on the first hard layer 601*b*1. In such an embodiment, the soft layer 601*a* may be positioned between the first hard layer 601*b*1 and the second hard layer 601*b*2.

In such an embodiment, the second hard layer 601*b*2 may be disposed on the soft layer 601*a*. In such an embodiment, the second hard layer 601b2 may be positioned between the soft layer 601a and the first hard coating layer 611.

In an exemplary embodiment, the first hard layer 601b1, the soft layer 601a and the second hard layer 601b2 may have a substantially same thickness as each other. In an alternative exemplary embodiment, at least two of the first hard layer 601b1, the soft layer 601a and the second hard layer 601b2 may have different thicknesses from each other. In one exemplary embodiment, for example, the first hard layer 601b1 (or the second hard layer 601b2) may have a thickness greater than a thickness of the soft layer 601a.

The first hard layer 601b1 (or the second hard layer 601b2) may have a hardness different from a hardness of the soft layer 601a. In one exemplary embodiment, for example, the first hard layer 601b1 may have a hardness greater than a hardness of the soft layer 601a. In such an embodiment, the second hard layer 601b2 may have a hardness greater than a hardness of the soft layer 601a. In an exemplary embodiment, the first hard layer 601b1 and the second hard layer 601b2 may have a substantially same hardness as each other.

Each of the first hard layer 601b1 and the second hard layer 601b2 may include a material substantially the same as a material included in, for example, the hard layer 601B described above with reference to FIG. 3.

The soft layer 601a may include a material substantially the same as a material included in the soft layer 601A described above with reference to FIG. 3.

The first hard coating layer 611 and the second hard coating layer 612 of FIG. 4 are substantially identical to the first hard coating layer 611 and the second hard coating layer 612 described above with reference to FIG. 1.

The base layer 601 of FIG. 4 may have a thickness substantially equal to a thickness of the base layer 601 of FIG. 1.

Figure 5:
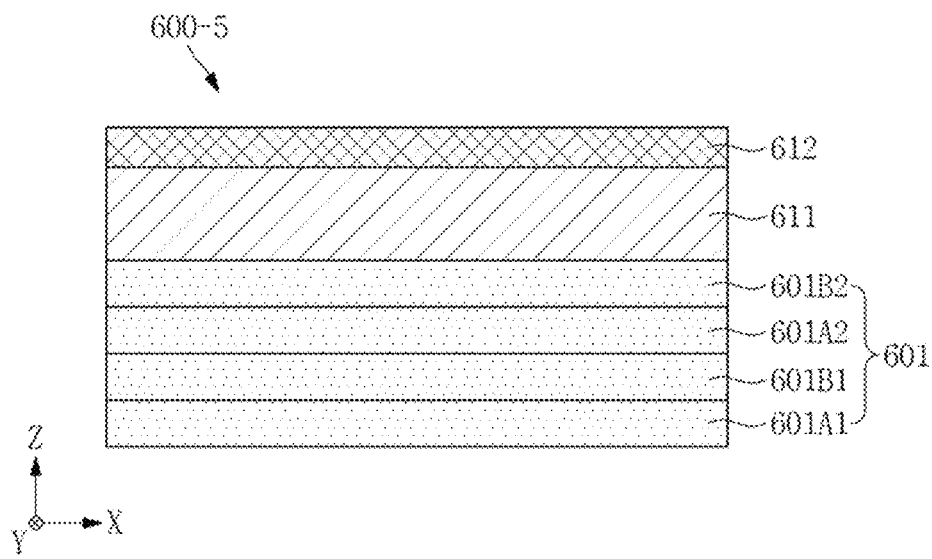
FIG. 5 is a cross-sectional view illustrating a window for a display device according to another alternative exemplary embodiment.

FIG. 5 is a cross-sectional view illustrating a window for a display device according to another alternative exemplary embodiment.

An exemplary embodiment of a window for a display device may include a base layer 601, a first hard coating layer 611 and a second hard coating layer 612, as illustrated in FIG. 5. In such an embodiment, the base layer 601 may include a first soft layer 601A1, a first hard layer 601B1, a second soft layer 601A2 and a second hard layer 601B2 arranged in the Z-axis direction.

In an exemplary embodiment, as shown in FIG. 5, the first hard layer 601B1 may be disposed on the first soft layer 601A1. In such an embodiment, the first hard layer 601B1 may be positioned between the first soft layer 601A1 and the second soft layer 601A2.

In such an embodiment, the second soft layer 601A2 may be disposed on the first hard layer 601B1. In such an embodiment, the second soft layer 601A2 may be positioned between the first hard layer 601B1 and the second hard layer 601B2.

In such an embodiment, the second hard layer 601B2 may be disposed on the second soft layer 601A2. In such an embodiment, the second hard layer 601B2 may be positioned between the second soft layer 601A2 and the first hard coating layer 611.

In an exemplary embodiment, the first soft layer 601A1, the first hard layer 601B1, the second soft layer 601A2 and the second hard layer 601B2 may have a substantially same thickness as each other. In an alternative exemplary embodiment, at least two of the first soft layer 601A1, the first hard layer 601B1, the second soft layer 601A2 and the second hard layer 601B2 may have different thicknesses from each other. In one exemplary embodiment, for example, the first hard layer 601B1 (or the second hard layer 601B2) may have a thickness greater than a thickness of the first soft layer 601A1 (or the second soft layer 601A2).

In an exemplary embodiment, the first hard layer 601B1 (or the second hard layer 601B2) and the first soft layer 601A1 (or the second soft layer 601A2) have different hardnesses from each other. In one exemplary embodiment, for example, the first hard layer 601B1 may have a hardness greater than a hardness of the first soft layer 601A1 (or the second soft layer 601A2). In such an embodiment, the second hard layer 601B2 may have a hardness greater than a hardness of the first soft layer 601A1 (or the second soft layer 601A2). In an exemplary embodiment, the first hard layer 601B1 and the second hard layer 601B2 may have a substantially same hardness as each other, and the first soft layer 601A1 and the second soft layer 601A2 may have a substantially same hardness as each other.

Each of the first hard layer 601B1 and the second hard layer 601B2 may include a material substantially the same as a material included in the hard layer 601B described above with reference to FIG. 3.

Each of the first soft layer 601A1 and the second soft layer 601A2 may include a material substantially the same as a material included in the soft layer 601A described above with reference to FIG. 3.

In an exemplary embodiment, the base layer 601 may include a greater number of soft layers and hard layers than the soft layers 601A1 and 601A2 and the hard layers 601B1 and 601B2 described above with reference to FIG. 5.

The first hard coating layer 611 and the second hard coating layer 612 of FIG. 5 are substantially identical to the first hard coating layer 611 and the second hard coating layer 612 described above with reference to FIG. 1.

The base layer 601 of FIG. 5 may have a thickness substantially equal to a thickness of the base layer 601 of FIG. 1.

Figure 6:
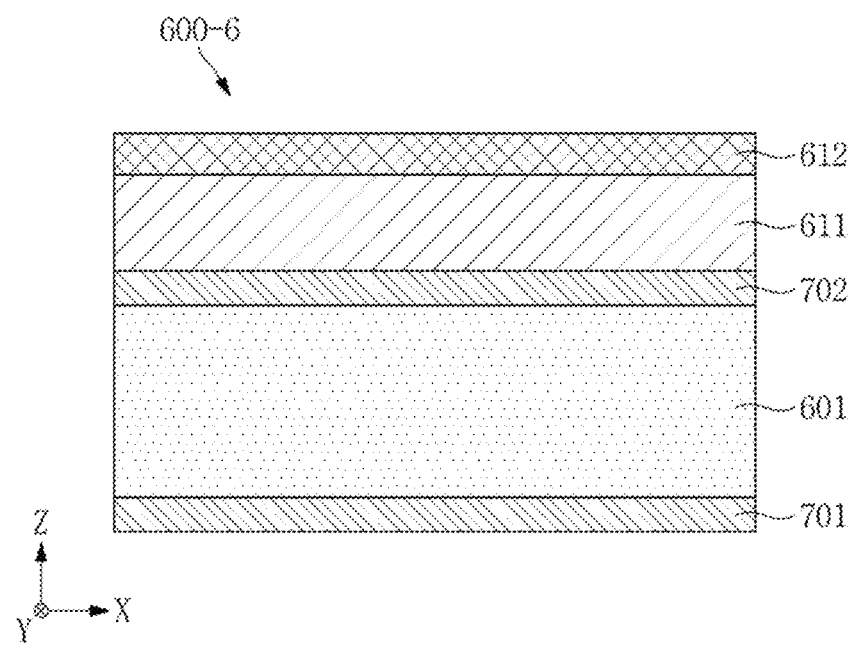
FIG. 6 is a cross-sectional view illustrating a window for a display device according to another alternative exemplary embodiment.

FIG. 6 is a cross-sectional view illustrating a window for a display device according to another alternative exemplary embodiment.

An exemplary embodiment of a window 600-6 for a display device includes a first auxiliary layer 701, a base layer 601, a second auxiliary layer 702, a first hard coating layer 611 and a second hard coating layer 612, as illustrated in FIG. 6.

The first auxiliary layer 701 may be disposed on a lower surface of the base layer 601. In one exemplary embodiment, for example, when one of two opposing surfaces of the base layer 601 facing each other in an X-axis direction that is more adjacent to the first hard coating layer 611 is defined as an upper surface of the base layer 601 and the other of the two opposing surfaces of the base layer 601 is defined as a lower surface of the base layer 601, the first auxiliary layer 701 may be disposed on the lower surface of the base layer 601 to face the lower surface of the base layer 601.

The second auxiliary layer 702 may be disposed on the upper surface of the base layer 601. In one exemplary embodiment, for example, the second auxiliary layer 702 may be disposed on the upper surface of the base layer 601 to face the upper surface of the base layer 601. In such an embodiment, the second auxiliary layer 702 may be positioned between the base layer 601 and the first hard coating layer 611.

In such an embodiment, the base layer 601 may be positioned between the first and second auxiliary layers 701 and 702.

The first auxiliary layer 701 and the second auxiliary layer 702 may improve heat resistance of the base layer 601. In such an embodiment, each of the first auxiliary layer 701 and the second auxiliary layer 702 may include one of polyimide ("PI"), PC, polyethersulfone, polyethylene naphthalate ("PEN"), polyphenylene sulfide and opaque liquid crystal polymer ("LCP"). In one exemplary embodiment, for example, each of the first auxiliary layer 701 and the second auxiliary layer 702 may include PI or polyethersulfone which have a high glass transition temperature of about 280 degrees or higher and have transparency suitable for a window of a display device.

Alternatively, the window 600-6 for a display device may include only one of the first auxiliary layer 701 and the second auxiliary layer 702 described above.

The base layer 601, the first hard coating layer 611 and the second hard coating layer 612 of FIG. 6 are substantially identical to the base layer 601, the first hard coating layer 611 and the second hard coating layer 612 described above with reference FIG. 1.

The window 600-6 of FIG. 6 may be manufactured by the following method.

In such a method, the base layer 601 is provided or formed on the first auxiliary layer 701.

Subsequently, the second auxiliary layer 702 is provided or formed on the base layer 601.

Next, a material for the first hard coating layer 611 is applied on the second auxiliary layer 702.

Thereafter, the first hard coating layer 611 is cured by heat or ultraviolet rays.

Next, a material for the second hard coating layer 612 is applied on the cured first hard coating layer 611.

Then, the second hard coating layer 612 is cured by heat or ultraviolet rays.

Figure 7:
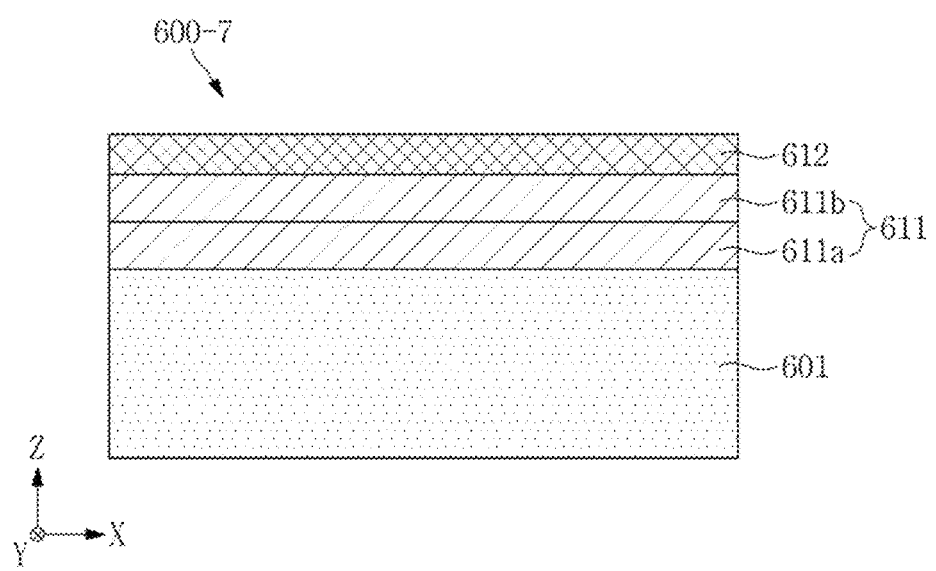
FIG. 7 is a cross-sectional view illustrating a window for a display device according to another alternative exemplary embodiment.

FIG. 7 is a cross-sectional view illustrating a window for a display device according to another alternative exemplary embodiment.

An exemplary embodiment of a window 600-7 for a display device may include a base layer 601, a first hard coating layer 611 and a second hard coating layer 612, as illustrated in FIG. 7. In such an embodiment, the second hard coating layer 612 may have a multilayer structure including at least two layers 611a and 611b. In one exemplary embodiment, for example, the second hard coating layer 612 may include a first layer 611a and a second layer 611b arranged along the Z-axis direction In an exemplary embodiment, the first layer 611a may be disposed on the base layer 601. In such an embodiment, the first layer 611a may be positioned between the base layer 601 and the second layer 611b.

In such an embodiment, the second layer 611b may be disposed on the first layer 611a. In such an embodiment, the second layer 611b may be positioned between the first layer 611a and the second hard coating layer 612.

The first layer 611a and the second layer 611b may have a substantially same thickness as each other or different thicknesses from each other.

Each of the first layer 611a and the second layer 611b may be formed using the material for the first hard coating layer 611 described above. In an exemplary embodiment, the first layer 611a and the second layer 611b may include a substantially same material as each other or different materials from each other.

The base layer 601 and the second hard coating layer 612 of FIG. 7 are substantially identical to the base layer 601 and the second hard coating layer 612 described above with reference to FIG. 1.

The first hard coating layer 611 of FIG. 7 may have a thickness substantially equal to a thickness of the first hard coating layer 611 of FIG. 1.

Figure 8:
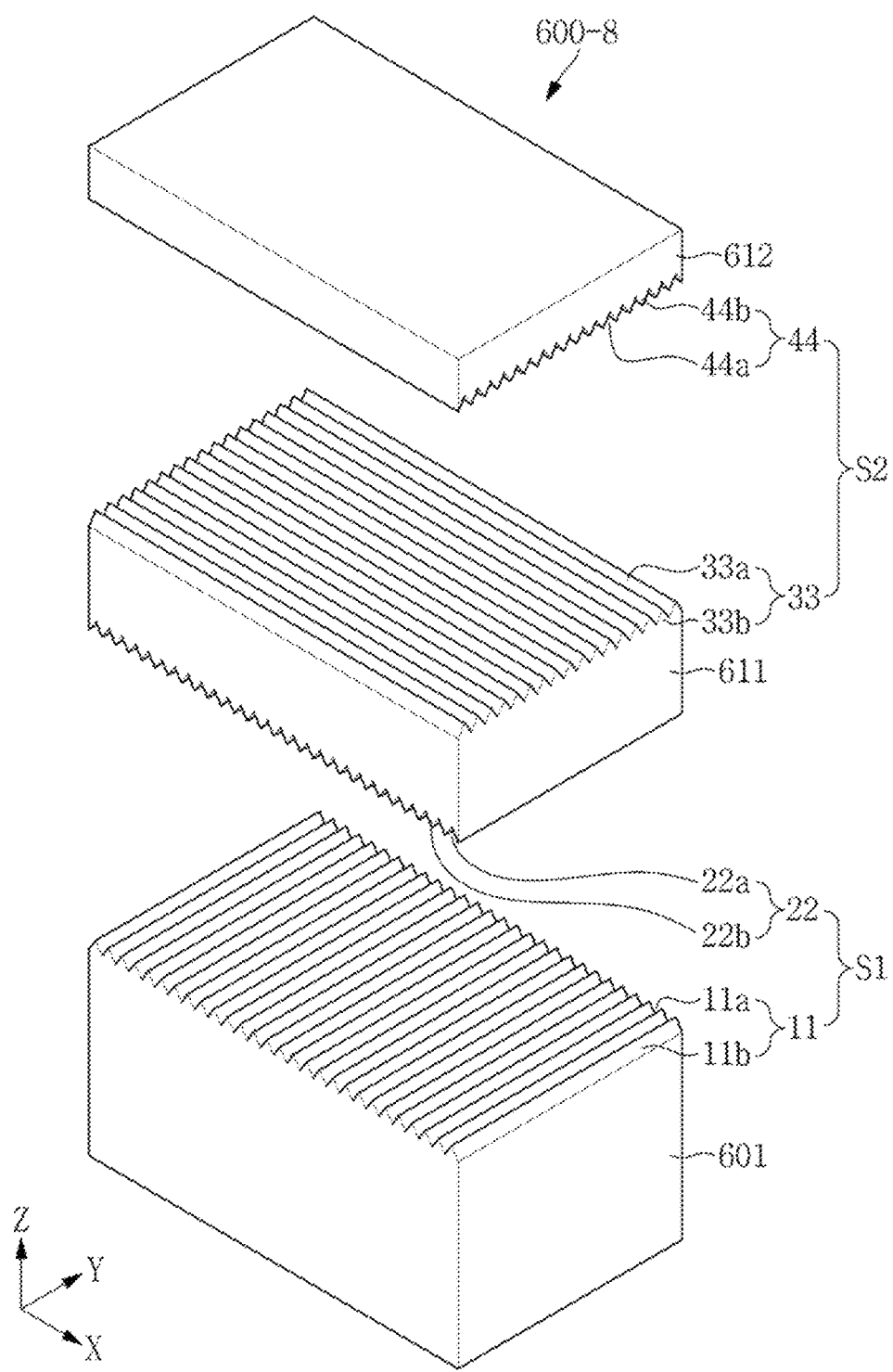
FIG. 8 is an exploded perspective view illustrating a window for a display device according to another alternative exemplary embodiment.

FIG. 8 is an exploded perspective view illustrating a window for a display device according to another alternative exemplary embodiment.

An exemplary embodiment of a window 600-8 for a display device may include a base layer 601, a first hard coating layer 611 and a second hard coating layer 612, as illustrated in FIG. 8. In such an embodiment, an interface S1 (hereinafter, a first interface) between the base layer 601 and the first hard coating layer 611 may have a concavo-convex shape. In such an embodiment, the first interface S1 may include depressed portions 11a and 22a and prominent portions 11b and 22b. In such an embodiment, an adhesive force between the base layer 601 and the first hard coating layer 611 may be improved.

The first interface S1 includes surfaces 11 and 22 of the base layer 601 and the first hard coating layer 611 that face each other. Among the facing surfaces 11 and 22 of the first interface S1, when the surface of the base layer 601 is defined as a first surface 11 and the surface of the first hard coating layer 611 is defined as a second surface 22, the first surface 11 includes a depressed portion 11a and a prominent portion 11b, and the second surface 22 includes a depressed portion 22a and a prominent portion 22b. In such an embodiment, the prominent portion 11b of the first surface 11 is inserted into the depressed portion 22a of the second surface 22, and the prominent portion 22b of the second surface 22 is inserted into the depressed portion 11a of the first surface 11.

In an exemplary embodiment, the prominent portions 11b and 22b of the first interface S1 may have a triangular prism shape, as shown in FIG. 8. In an alternative exemplary embodiment, the prominent portions 11b and 22b of the first interface S1 may have a quadrangular prism shape or a semicircular prism shape.

In an exemplary embodiment, an interface S2 (hereinafter, a second interface) between the first hard coating layer 611 and the second hard coating layer 612 may have a concavo-convex shape. In such an embodiment, the second interface S2 may include depressed portions 33a and 44a and prominent portions 33b and 44b. In such an embodiment, an adhesive force between the first hard coating layer 611 and the second hard coating layer 612 may be improved.

The second interface S2 includes surfaces 33 and 44 of the first hard coating layer 611 and the second hard coating layer 612 that face each other. Among the facing surfaces 33 and 44 of the second interface S2, when the surface of the first hard coating layer 611 is defined as a third surface 33 and the surface of the second hard coating layer 612 is defined as a fourth surface 44, the third surface 33 includes a depressed portion 33a and a prominent portion 33b and the fourth surface 44 includes a depressed portion 44a and a prominent portion 44b. In such an embodiment, the prominent portion 33b of the third surface 33 is inserted into the depressed portion 44a of the fourth surface 44, and the prominent portion 44b of the fourth surface 44 is inserted into the depressed portion 33a of the third surface 33.

In an exemplary embodiment, the prominent portions 33b and 44b of the second interface S2 may have a triangular prism shape, as shown in FIG. 8. In an alternative exemplary embodiment, the prominent portions 33b and 44b of the second interface S2 may have a quadrangular prism shape or a semicircular prism shape.

An extension direction of the prominent portions 11b and 22b included in the first interface S1 and an extension direction of the prominent portions 33b and 44b included in the second interface S2 may cross each other. In one exemplary embodiment, for example, as illustrated in FIG. 8, the prominent portions 11b and 22b of the first interface S1 extend in a direction parallel to a Y axis and the prominent portions 33b and 44b of the second interface S2 extend in a direction parallel to the X axis. In such an embodiment, the luminance of a light passing through the window 600-8 may be improved in addition to the improvement in adhesion between adjacent layers.

In an exemplary embodiment, the prominent portions 11b and 22b of the first interface S1 and the prominent portions 33b and 44b of the second interface S2 may have a substantially same shape as each other, as illustrated in FIG. 8.

In an alternative exemplary embodiment, although not illustrated, the prominent portions 11b and 22b of the first interface S1 and the prominent portions 33b and 44b of the second interface S2 may have different shapes from each other. In one exemplary embodiment, for example, the prominent portions 11b and 22b of the first interface S1 may have a triangular prism shape and the prominent portions 33b and 44b of the second interface S2 may have a quadrangular prism shape.

Other features the base layer 601, the first hard coating layer 611 and the second hard coating layer 612 of FIG. 8 are substantially the same as those of the base layer 601, the first hard coating layer 611, and the second hard coating layer 612 described above with reference to FIG. 1.

Figure 9A:
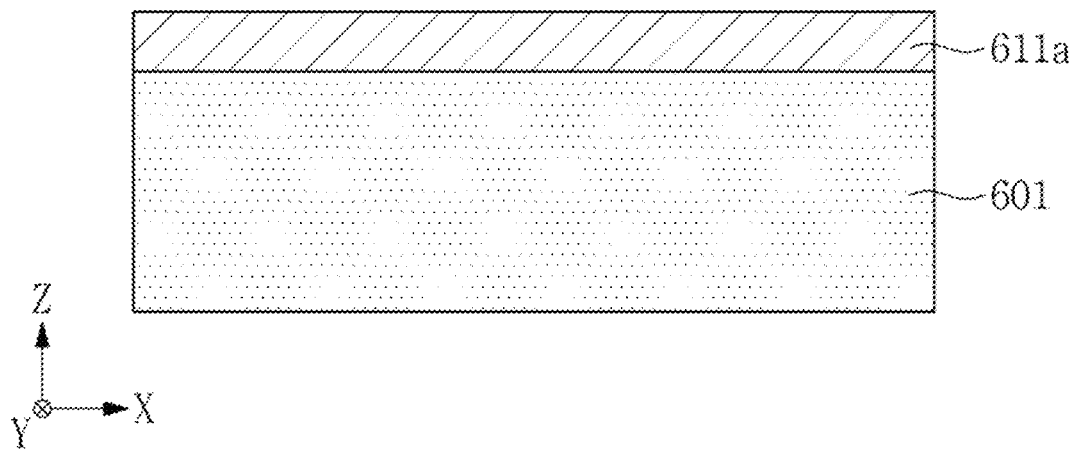
FIGS. 9A, 9B and 9C are views showing an exemplary embodiment of a method of manufacturing a first hard coating layer.
Figure 9B:
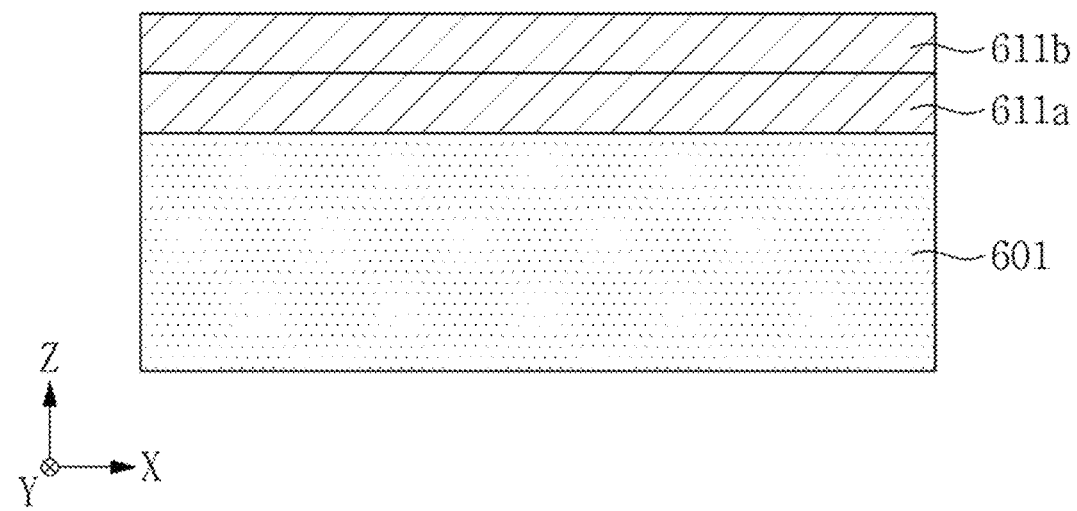
Figure 9C:
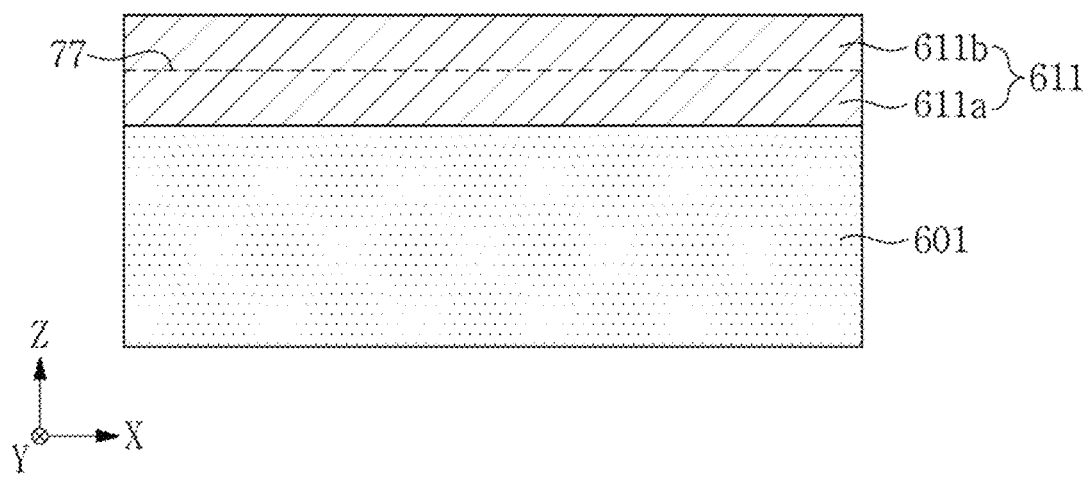

FIGS. 9A, 9B and 9C are views showing an exemplary embodiment of a method of manufacturing a first hard coating layer.

In an exemplary embodiment, the first hard coating layer 611 may be manufactured through a half curing process, which will hereinafter be described in detail.

In such an embodiment, as illustrated in FIG. 9A, a material for the first layer 611a is applied on the base layer 601.

Then, the first layer 611a is half-cured by ultraviolet rays or heat.

Subsequently, as illustrated in FIG. 9B, a material for the second layer 611b is applied on the half-cured first layer 611a.

Next, as illustrated in FIG. 9C, the first layer 611a and the second layer 611b are fully cured by ultraviolet rays or heat. In such an embodiment, this complete curing fully cures the first layer 611a and the second layer 611b to provide the first hard coating layer 611.

In such an embodiment, as illustrated in FIG. 1 or 7, a material for the second hard coating layer 612 is applied on the first hard coating layer 611 and a curing process of the second hard coating layer 612 is performed.

In an exemplary embodiment, an interface 77 between the fully cured first and second layers 611a and 611b be selectively formed depending on the material for the first layer 611a and the material for the second layer 611b.

In an exemplary embodiment where the first hard coating layer 611 has a multilayer structure including three or more layers, at least two of the three or more layers may have different thicknesses from each other. Alternatively, the three or more layers may all have a substantially same thickness as each other.

In an exemplary embodiment, where the thickness of the first hard coating layer 611 of the window 600-1 is sufficiently thick, the first hard coating layer 611 may be formed to be thick by the half-curing process described above with reference to FIGS. 9A, 9B and 9C.

An exemplary embodiment of the windows 600-1, 600-3, 600-4, 600-5, 600-6, 600-7 or 600-8 described above with reference to FIGS. 1, 3, 4, 5, 6, 7 and 8 may further include the ultraviolet blocking element 65 described above with reference to FIG. 2. In such an embodiment, at least one of the first auxiliary layer 701 and the second auxiliary layer 702 described above with reference to FIG. 7 may further include the ultraviolet blocking element 65.

In an exemplary embodiment of the window 600-1, 600-2, 600-6, 600-7 or 600-8 described above with reference to FIGS. 1, 2, 6, 7 and 8, the base layer 601 may include soft layers 601A, 601a, 601A1 and 601A2 and hard layers 601B, 601b1, 601b2, 601B1 and 601B2 illustrated in FIGS. 3, 4 and 5.

An exemplary embodiment of the window 600-1, 600-2, 600-3, 600-4, 600-5, 600-7 or 600-8 described above with reference to FIGS. 1, 2, 3, 4, 5, 7 and 8 may further include at least one of the first and second auxiliary layers 701 and 702 illustrated in FIG. 6.

In an exemplary embodiment of the window 600-1, 600-2, 600-3, 600-4, 600-5, 600-6 or 600-8 described above with reference to FIGS. 1, 2, 3, 4, 5, 6 and 8, the first hard coating layer 611 may have a multilayer structure including a plurality of layers (e.g., the first layer 611a and the second layer 611b) as illustrated in FIG. 7.

In an exemplary embodiment of the window 600-1, 600-2, 600-3, 600-4, 600-5, 600-6 or 600-7 described above with reference to FIGS. 1, 2, 3, 4, 5, 6 and 7, interfaces of adjacent layers thereof may have a concavo-convex shape as illustrated in FIG. 8.

Figure 11:
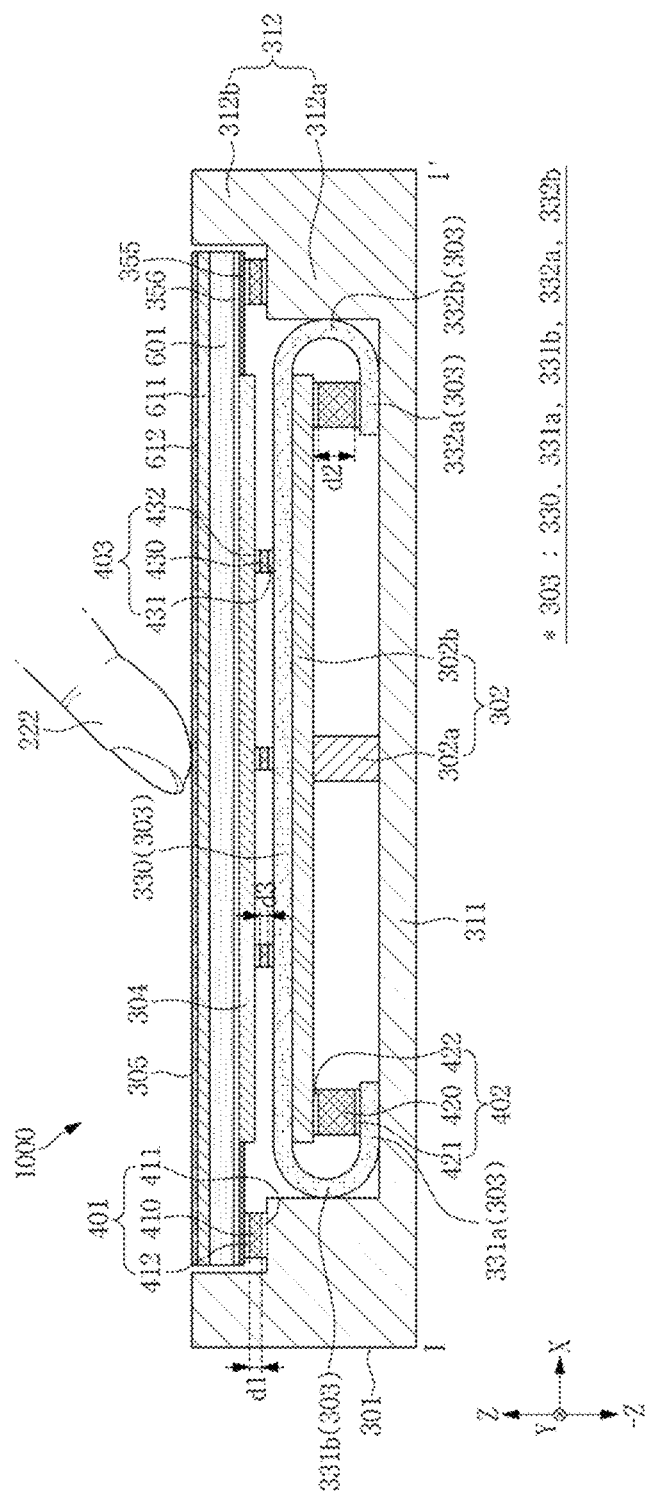
FIG. 11 is a cross-sectional view taken along line I-I' of FIG. 10.

FIG. 10 is an exploded perspective view illustrating a display device according to an exemplary embodiment, and FIG. 11 is a cross-sectional view taken along line I-I' of FIG. 10. More particularly, FIG. 11 shows the display device of FIG. 10 in a state in which all elements thereof are combined.

An exemplary embodiment, a display device 1000 includes a frame 301, a panel support portion 302, a display panel 303, a touch sensing portion 304, a window 305, a first pressure sensing portion 401, a second pressure sensing portion 402 and a third pressure sensing portion 403, as illustrated in FIGS. 10 and 11.

In such an embodiment, as illustrated in FIGS. 10 and 11, the frame 301 may include a base portion 311 and a side portion 312.

In one exemplary embodiment, for example, the base portion 311 of the frame 301 may have a quadrangular plate shape, as illustrated in FIG. 10.

In one exemplary embodiment, for example, the side portion 312 of the frame 301 may have a quadrangular ring shape or a quadrangular closed loop shape, as illustrated in FIG. 8. The side portion 312 has a shape protruding from an edge portion of the base portion 311. The side portion 312 may protrude at an angle of about 90 degrees with respect to a surface of the base portion 311. In one exemplary embodiment, for example, the side portions 312 may protrude in the Z-axis direction. In an exemplary embodiment, as illustrated in FIGS. 10 and 11, the base portion 311 and the side portion 312 may be integrally formed as a single unitary and indivisible unit.

In an exemplary embodiment, as illustrated in FIG. 11, the side portion 312 may have a stepped cross-section. In such an embodiment, the side portions 312 may include an inner side portion 312a and an outer side portion 312b having different heights from each other.

Each of the inner side portion 312a and the outer side portion 312b may have a quadrangular ring shape or a quadrangular closed loop shape. The outer side portion 312b surrounds the inner side portion 312a. The outer side portion 312b has a height greater than a height of the inner side portion 312a. Herein, the respective heights of the inner side portion 312a and the outer side portion 312b mean distances of top surfaces thereof with respect to a bottom surface of the base portion 311 in the Z-axis direction. In an exemplary embodiment, the height of the outer side portion 312b measured in the Z-axis direction with respect to the base portion 311 is higher than the height of the inner side portion 312a measured in the Z-axis direction with respect to the base portion 311. The inner side portion 312a and the outer side portion 312b may be integrally formed as a single unitary and indivisible unit.

In an alternative exemplary embodiment, although not illustrated, the side portion 312 may not include the outer side portion 312b. In such an embodiment, a portion of the base portion 311 corresponding to the outer side portion 312b may be removed.

In an exemplary embodiment, as illustrated in FIG. 11, the panel support portion 302 is disposed between the base portion 311 of the frame 301 and the window 305. The panel support portion 302 is located at a space (hereinafter, an accommodation space) defined by being surrounded by the base portion 311, the inner side portion 312a and the window 305 of the frame 301.

In an exemplary embodiment, as illustrated in FIGS. 10 and 11, the panel support portion 302 includes a support base 302a and a support plate 302b.

The support base 302a is disposed between the support plate 302b and the base portion 311 of the frame 301. In one exemplary embodiment, for example, the support base 302a may be positioned between a center portion of the support plate 302b and a center portion of the base portion 311.

The support base 302a may have a bar shape, as illustrated in FIG. 10. Such a bar-shaped support base 302a may be positioned parallel to two facing sides of four sides of the side portion 312. In one exemplary embodiment, for example, as illustrated in FIG. 10, the support base 302a may be parallel to two sides that face each other and have relatively longer lengths among the four sides of the side portion 312. These two sides may be sides facing each other in the X-axis direction.

In an exemplar embodiment, the support base 302a combines, e.g., fastens, the support plate 302b to the frame 301. In such an embodiment, one side end portion of the support base 302a is fastened to the support plate 302b and another end of the support base 302a is fastened to the base portion 311 of the frame 301.

The support base 302a may include an elastic material. Accordingly, when the window 305 is pressed in the −Z-axis direction by a finger 222 or the like, the support base 302a may be compressed by the pressing force. However, when this force is removed, the support base 302a is restored to the original shape thereof.

The support plate 302b may have a quadrangular plate shape. The support plate 302b has an area less than an area of the base portion 311 described above. In an exemplary embodiment, as illustrated in FIGS. 10 and 11, the support plate 302b is surrounded by the inner side portion 312a. In such an embodiment, the inner side portion 312a surrounds the support plate 302b while being spaced apart from the support plate 302b with a predetermined distance. The support plate 302b faces a side surface of the inner side portion 312a. The side surface of the inner side portion 312a may be a surface parallel to a plane defined by the Y axis and the Z axis (hereinafter, a YZ plane) or a surface parallel to a plane defined by the X axis and the Z axis (hereinafter, an XZ plane).

In an exemplary embodiment, the support plate 302b and the support base 302a may include a substantially same material as each other, for example, an elastic material. In one exemplary embodiment, for example, the support plate 302b and the support base 302a may include a form tape or a foam tape.

The display panel 303 displays images. In an exemplary embodiment, although not illustrated, the display panel 303 includes a plurality of pixels for displaying images. The display panel 303 has a display area 303a and a non-display area 303b, and the pixels are located in the display area 303a of the display panel 303.

The display panel 303 is disposed at the accommodation space described above, as illustrated in FIG. 11. The display panel 303 may be a flexible display panel 303 that is bendable.

In an exemplary embodiment, as illustrated in FIG. 11, a portion 330 (hereinafter, a center portion) of the display panel 303 is supported by the panel support portion 302. The center portion 330 of the display panel 303 may be positioned between the support plate 302b and the window 305.

In an exemplary embodiment, another portion 331a (hereinafter, a first edge portion 331a) of the display panel 303 is positioned between the support plate 302b and the base portion 311, as illustrated in FIG. 10. In such an embodiment, the first edge portion 331a is positioned between one side edge of the support plate 302b and the base portion 311.

In an exemplary embodiment, still another portion 331b (hereinafter, a first curve portion 331b) of the display panel 303 may have a curved shape. The first curve portion 331b passes through a gap between one side edge of the support plate 302b and the inner side portion 312a. The first curve portion 331b faces a side surface of the inner side portion 312a. The first curve portion 331b is connected between the center portion 330 and the first edge portion 331a.

In an exemplary embodiment, still another portion 332a (hereinafter, a second edge portion) of the display panel 303 is positioned between the support plate 302b and the base portion 311, as illustrated in FIG. 11. In such an embodiment, the second edge portion 332a is positioned between another side edge of the support plate 302b and the base portion 311.

In an exemplary embodiment, still another portion 332b (hereinafter, a second curve portion) of the display panel 303 has a curved shape. The second curve portion 332b passes through a gap between another side edge of the support plate 302b and the inner side portion 312a. The second curve portion 332b faces another side surface of the inner side portion 312a. The second curve portion 332b is connected between the center portion 330 and the second edge portion 332a.

The center portion 330, the first curve portion 331b, the first edge portion 331a, the second curve portion 332b and the second edge portion 332a of the display panel 303 may be integrally formed as a single unitary and indivisible unit.

The window 305 faces at least a portion of the frame 301. In one exemplary embodiment, for example, the window 305 may face the side portion 312 of the frame 301. In an exemplary embodiment, as illustrated in FIG. 11, an edge of the window 305 faces an upper surface of the inner side portion 312a. The upper surface of the inner side portion 312a is a surface parallel to a plane defined by the X axis and the Y axis (hereinafter, an XY plane).

The window 305 has a light transmitting area 305a and a light blocking area 305b, as illustrated in FIG. 10. The light transmitting area 305a of the window 305 is located to correspond to (e.g., to overlap in a plan view in the Z axis direction) the display area 303a of the display panel 303.

The light blocking area 305b of the window 305 is located at an edge portion of the window 305. The light blocking area 305b has a ring shape surrounding the light transmitting area 305a.

In such an embodiment, the window 305 may be substantially identical to an exemplary embodiment of the window 600-1, 600-2, 600-3, 600-4, 600-5, 600-6, 600-7 or 600-8 described above with reference to FIGS. 1, 2, 3, 4, 5, 6, 7 and 8. In such an embodiment, the window 305 may include the base layer 601, the first hard coating layer 611 and the second hard coating layer 612, as illustrated in FIG. 11.

The window 305 may further include a light blocking member 355 and a transparent tape 356.

The transparent tape 356 is located at a lower surface of the base layer 601. In one exemplary embodiment, for example, the transparent tape 356 may be attached to the lower surface of the base layer 601.

The light blocking member 355 is attached to the base layer 601 by the transparent tape 356. The light blocking member 355 is located at the light blocking area 305b.

In an exemplary embodiment, the base layer 601 may directly contact the touch sensing portion 304. In such an embodiment, a portion of the base layer 601 located at the light transmitting area 305a may directly contact the touch sensing portion 304. In an alternative exemplary embodiment, where the touch sensing portion 304 and the third pressure sensing portion 403 are not included in the display device 1000, a portion of the base layer 601 located at the light transmitting area 305a may directly contact the display panel 303.

In an exemplary embodiment, where the window 305 has a structure as illustrated in FIG. 6, the first auxiliary layer 701 may be positioned between the transparent tape 356 and the base layer 601.

In an exemplary embodiment, the hard coating layers 611 and 612 included in the window 305 are located in an outer side direction of (or outwardly of) the display device 1000 with respect to the base layer 601, the hard coating layers 611 and 612 are subjected to compressive stress against external impacts. Accordingly, in such an embodiment, impact resistance of the window 305 may be improved.

The touch sensing portion 304 may be positioned between the display panel 303 and the window 305, as illustrated in FIG. 11. When a touch is applied to the window 305 by the finger 222 or the like, the touch sensing portion 304 may sense the touch. The touch sensing portion 304 generates a touch sensing signal as a result of the sensing and transmits the generated touch sensing signal to a panel driver 306. Although not illustrated, the touch sensing portion 304 may include at least one touch sensing element.

The first pressure sensing portion 401 is positioned between the window 305 and the frame 301. In one exemplary embodiment, for example, the first pressure sensing portion 401 may be positioned between an edge of the window 305 and the inner side portion 312a, as illustrated in FIG. 11. Specifically, the first pressure sensing portion 401 may be positioned between an edge of the window 305 and the upper surface of the inner side portion 312a.

As illustrated in FIG. 11, when the window 305 is pressed in the −Z-axis direction by the finger 222 or the like, the first pressure sensing portion 401 senses the pressing force, i.e., the pressure. The first pressure sensing portion 401 generates a pressure sensing signal as a result of the sensing and transmits the generated pressure sensing signal to the panel driver 306.

The panel driver 306 may include a flexible circuit board 306a such as a chip-on-film ("COF") and a printed circuit board 306b connected to the flexible circuit board 306a. In an exemplary embodiment, as illustrated in FIG. 9, the panel driver 306 may be electrically connected to the non-display area 303b of the display panel 303.

In an exemplary embodiment, the first pressure sensing portion 401 may include a capacitor including a first electrode 411, a second electrode 412 and an elastic element 410. The first electrode 411 and the second electrode 412 face each other with the elastic element 410 interposed therebetween. The first electrode 411 and the second electrode 412 correspond to one electrode and another electrode of the capacitor, respectively, and the elastic element 410 corresponds to a dielectric element of the capacitor.

In such an embodiment, when a thickness of the elastic element 410 changes due to the pressure applied to the first pressure sensing portion 401, a distance between the first electrode 411 and the second electrode 412 changes depending on the changed thickness, and a capacitance of the capacitor changes based on the changed distance. The first pressure sensing portion 401 may output a voltage across the capacitor, which has been changed due to the capacitance change of the capacitor, as a pressure sensing signal.

In an exemplary embodiment, the display device 1000 may include a plurality of first pressure sensing portions 401. In such an embodiment, the plurality of first pressure sensing portions 401 may be located at different positions on the upper surface of the inner side portion 312a, as illustrated in FIG. 10.

The second pressure sensing portion 402 is located at the panel support portion 302 and the first edge portion 331a of the display panel 303. In one exemplary embodiment, for example, as illustrated in FIG. 11, the second pressure sensing portion 402 may be positioned between the support plate 302b of the panel support portion 302 and the first edge portion 331a of the display panel 303. Herein, when a portion of the display panel 303 where the display area 303a is located is defined as a front surface of the display panel 303 and an opposite surface of the front surface is defined as a back surface of the display panel 303, the second pressure sensing portion 402 is located at the back surface of the first edge portion 331a. The front surface of the display panel 303 includes a surface facing the window 305. The front surface of the display panel 303 at the first edge portion 331a faces the base portion 311, and the back surface at the first edge portion 331a faces the second pressure sensing portion 402.

In an exemplary embodiment, as illustrated in FIG. 11, when the window 305 is pressed in the −Z-axis direction by the finger 222 or the like, the pressure corresponding to the pressing force is transmitted to the touch sensing portion 304, the display panel 303 and the panel support portion 302 below the window 305. Then, the support base 302a is compressed by the pressure and the support plate 302b descends toward the base portion 311. In such an embodiment, the support plate 302b presses the second pressure sensing portion 402 and thus the second pressure sensing portion 402 senses a pressure corresponding to the pressing force. The second pressure sensing portion 402 generates a pressure sensing signal as a result of the sensing and transmits the generated pressure sensing signal to the panel driver 306.

The second pressure sensing portion 402 may be a capacitor including a first electrode 421, a second electrode 422 and an elastic element 420. In such an embodiment, the second pressure sensing portion 402 may have a structure substantially the same as that of the first pressure sensing portion 401 described above, and any repetitive detailed description thereof will be omitted.

In an exemplary embodiment, the display device 1000 may include a plurality of second pressure sensing portions 402. In such an embodiment, the plurality of second pressure sensing portions 402 may be located at different positions of the first edge portion 331a and the second edge portion 332a, as illustrated in FIG. 11.

The third pressure sensing portion 403 may be positioned between the display panel 303 and the window 305. In one exemplary embodiment, for example, the third pressure sensing portion 403 may be positioned between the front surface of the display panel 303 and the light transmitting area 305a of the window 305. In such an embodiment, the third pressure sensing portion 403 may be positioned between the display area 303a of the display panel 303 and the light transmitting area 305a of the window 305.

In an exemplary embodiment, where the touch sensing portion 304 is positioned between the display panel 303 and the window 305, the third pressure sensing portion 403 may be positioned between the display panel 303 and the touch sensing portion 304. In one exemplary embodiment, for example, the third pressure sensing portion 403 may be positioned between the front surface of the display panel 303 and the touch sensing portion 304. In such an embodiment, the third pressure sensing portion 403 may be positioned between the display area 303a of the display panel 303 and the touch sensing portion 304.

In an alternative exemplary embodiment, although not illustrated, the third pressure sensing portion 403 may be located in the touch sensing portion 304.

As illustrated in FIG. 11, when the window 305 is pressed in the −Z-axis direction by the finger 222 or the like, the pressure corresponding to the pressed force is transmitted to the third pressure sensing portion 403 below the window 305. Accordingly, the third pressure sensing portion 403 senses the pressure. The third pressure sensing portion 403 generates a pressure sensing signal as a result of the sensing and transmits the generated pressure sensing signal to the panel driver 306.

The third pressure sensing portion 403 may include a capacitor including a first electrode 431, a second electrode 432 and an elastic element 430. In such an embodiment, the third pressure sensing portion 403 may have a structure substantially the same as that of the first pressure sensing portion 401 described above, and any repetitive detailed description thereof will be omitted.

In an exemplary embodiment, the display device 1000 may include a plurality of third pressure sensing portion 403. In such an embodiment, the plurality of third pressure sensing portion 403 may be located at different positions of the display area 303a included in the display panel 303.

Figure 12:
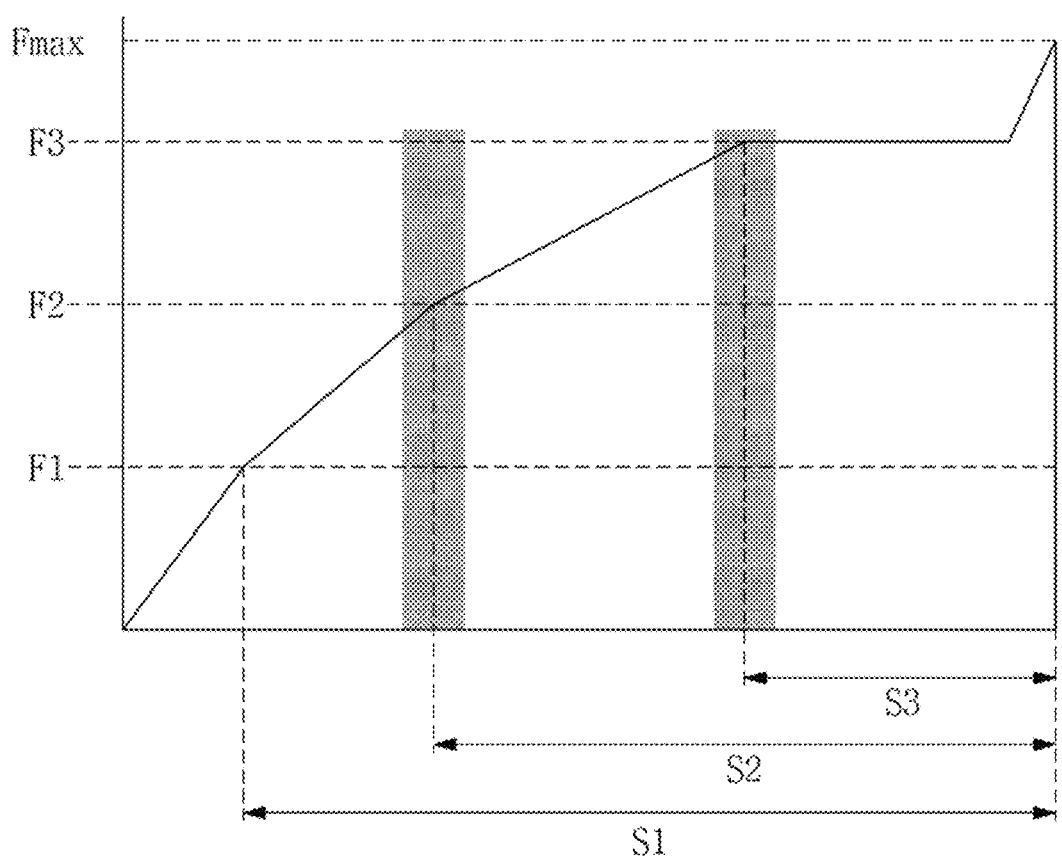
FIG. 12 is a graph showing sensitivities of first, second and third pressure sensing portions of FIG. 11.

FIG. 12 is a graph showing sensitivities of first, second and third pressure sensing portions of FIG. 11.

The first pressure sensing portion 401, the second pressure sensing portion 402 and the third pressure sensing portion 403 described above may have different sensitivities (e.g., signal to noise ratio) from each other, which hereinafter will be referred to as pressure sensitivity.

In one exemplary embodiment, for example, the first pressure sensing portion 401 of the first, second and third pressure sensing portions 401, 402 and 403 may have a highest pressure sensitivity, and the third pressure sensing portion 403 may have a lowest pressure sensitivity. In such an embodiment, the second pressure sensing portion 402 may have a pressure sensitivity higher than that of the first pressure sensing portion 401 and lower than that of the third pressure sensing portion 403.

In an exemplary embodiment, the first pressure sensing portion 401 operates in a first operation section S1, the second pressure sensing portion 402 operates in a second operation section S2, and the third pressure sensing portion 403 operates in a third operation section S3. In such an embodiment, the first pressure sensing portion 401 generates a pressure sensing signal in the first operation section S1, the second pressure sensing portion 402 generates a pressure sensing signal in the second operation section S2, and the third pressure sensing portion 403 generates a pressure sensing signal in the third operation section S3.

Due to such differences of the first pressure sensing portion 401, the second pressure sensing portion 402 and the third pressure sensing portion 403 in sensitivity, the first pressure sensing portion 401, the second pressure sensing portion 402 and the third pressure sensing portion 403 respond to forces of different magnitudes. In one exemplary embodiment, for example, the first pressure sensing portion 401 responds to a force substantially equal to or greater than a small force F1 (hereinafter, a first pressure), the third pressure sensing portion 403 responds to a force substantially equal to or greater than a large force F3 (hereinafter, a third pressure), and the second pressure sensing portion 402 responds to a force substantially equal to or greater than an intermediate force F2 (hereinafter, a second pressure) which has a magnitude between the first pressure F1 and the third pressure F3.

Accordingly, in such an embodiment, when a pressure substantially equal to or greater than the first pressure F1 and less than the second pressure F2 is applied to the window 305 of the display device 1000 in the −Z-axis direction, the first pressure sensing portion 401 outputs a pressure sensing signal, while each of the second and third pressure sensing portions 402 and 403 does not output a pressure sensing signal.

In such an embodiment, when a pressure substantially equal to or greater than the second pressure F2 and less than the third pressure F3 is applied to the window 305 of the display device 1000 in the −Z-axis direction, each of the first and second pressure sensing portions 401 and 402 outputs a pressure sensing signal, while the third pressure sensing portion 403 does not output a pressure sensing signal.

In such an embodiment, when a pressure substantially equal to or greater than the third pressure F3 is applied to the window 305 of the display device 1000 in the −Z-axis direction, each of the first, second and third pressure sensing portions 401, 402 and 403 outputs a pressure sensing signal.

In such an embodiment, the first, second and third pressure sensing portions 401, 402 and 403 may have different levels of modulus (or elastic force) to achieve the sensitivity differences described above. In one exemplary embodiment, for example, the moduli of the elastic elements 410, 420 and 430 respectively included in the first, second and third pressure sensing portions 401, 402 and 403 satisfy the following inequation: $\varepsilon 1 < \varepsilon 2 < \varepsilon 3$.

In the inequation above, $\varepsilon 1$ denotes a modulus (hereinafter, a first modulus) of the elastic element 410 included in the first pressure sensing portion 401, $\varepsilon 2$ denotes a modulus (hereinafter, a second modulus) of the elastic element 420 included in the second pressure sensing portion 402, and $\varepsilon 3$ denotes a modulus (hereinafter, a third modulus) of the elastic element 430 included in the third pressure sensing portion 403.

In an exemplary embodiment, as described above, the first modulus ε1 is the smallest and the third modulus ε3 is the greatest. In such an embodiment, the second modulus ε2 is greater than the first modulus ε1 and less than the third modulus ε3.

In such an embodiment, as described above, the modulus ε1 of the elastic element 410 of the first pressure sensing portion 401 may be the smallest, and the modulus ε3 of the elastic element 430 of the third pressure sensing portion 403 may be the greatest. In such an embodiment, the elastic element 420 of the second pressure sensing portion 402 may have a modulus ε2 which is greater than that of the elastic element 410 of the first pressure sensing portion 401 and less than that of the elastic element 430 of the third pressure sensing portion 403. Accordingly, under a same pressure, the elastic element 410 of the first pressure sensing portion 401 is relatively easily deformed, while the elastic element 430 of the third pressure sensing portion 403 is not relatively easily deformed.

In an exemplary embodiment, as described above, since the first, second and third pressure sensing portions 401, 402 and 403 have different sensitivities from each other, when the pressure applied to the window 305 gradually increases, the first pressure sensing portion 401 operates first, the second pressure sensing portion 402 operates thereafter, and then the third pressure sensing portion 403 operates.

The elastic elements 410, 420 and 430 respectively included in the first, second and third pressure sensing portions 401, 402 and 403 may have different thicknesses from each other. In one exemplary embodiment, for example, the thicknesses of the elastic elements 410, 420 and 430 respectively included in the first, second and third pressure sensing portions 401, 402 and 403 satisfy the following inequation: d1≤d2>>d3 (or d1≤d2 and d3<<d2).

In the inequation above, d1 denotes a thickness (hereinafter, a first thickness) of the elastic element 410 included in the first pressure sensing portion 401, d2 denotes a thickness (hereinafter, a second thickness) of the elastic element 420 included in the second pressure sensing portion 402, and d3 denotes a thickness (hereinafter, a third thickness) of the elastic element 430 included in the third pressure sensing portion 403.

In an exemplary embodiment, the second thickness d2 is substantially equal to or greater than the first thickness d1, and the third thickness d3 is less than the second thickness d2. In such an embodiment, the third thickness d3 is considerably less than the second thickness d2.

Due to the above-described differences between the moduli and thicknesses of the elastic elements, when a pressure applied to the window 305 gradually increases, the elastic element 410 of the first pressure sensing portion 401 is firstly compressed to a maximum, the elastic element 420 of the second pressure sensing portion 402 is compressed to a maximum thereafter, and then the elastic element 430 of the third pressure sensing portion 403 is compressed to a maximum.

The thickness of the elastic element determines an overall thickness of the pressure sensing portion including the elastic element, such that the less the thickness of the elastic element, the less the overall thickness of the pressure sensing portion. On the other hand, the less the thickness of the elastic element, the greater the probability of occurrence of sensing error (or sensing noise). Accordingly, a sensing error may occur from the third pressure sensing portion 403 and the first pressure sensing portion 401 which include the elastic element having a relatively small thickness. However, in an exemplary embodiment, since the second pressure sensing portion 402 which includes the elastic element 420 having a relatively large thickness operates together with the third pressure sensing portion 403 and the first pressure sensing portion 401, the sensing error may be substantially minimized.

In such an embodiment, since the first pressure sensing portion 401 and the third pressure sensing portion 403 which relatively greatly affect the overall thickness of the display device 1000 include elastic elements having a relatively small thickness while the second pressure sensing portion 402 which does not affect the overall thickness of the display device 1000 includes the elastic element 420 having a relatively large thickness, the sensing error may be substantially minimized while the display device 1000 is allowed to have a thin thickness.

In an exemplary embodiment, at a room temperature, the elastic element 410 of the first pressure sensing portion 401 may have a modulus in a range from about 0.01 megapascal (Mpa) to about 3,000 MPa, the elastic element 420 of the second pressure sensing portion 402 may have a modulus in a range from about 0.01 Mpa to about 5,000 MPa, and the elastic element 430 of the third pressure sensing portion 403 may have a modulus in a range from about 0.01 MPa to about 8,000 MPa. In one exemplary embodiment, for example, the elastic element 410 of the first pressure sensing portion 401 may have a modulus in a range from about 0.1 Mpa to about 3,000 MPa, the elastic element 420 of the second pressure sensing portion 402 may have a modulus in a range from about 3,000 Mpa to about 5,000 MPa, and the elastic element 430 of the third pressure sensing portion 403 may have a modulus in a range from about 5,000 MPa to about 8,000 MPa.

The elastic element 410 of the first pressure sensing portion 401 may include at least one of PI, an acryl-based material, a urethane-based material, a Si-rubber-based material, a synthetic rubber and a synthetic resin. Alternatively, the elastic element 410 of the first pressure sensing portion 401 may be in the form of a foamed film (or a porous film) including at least one of a synthetic rubber and a synthetic resin. In such an embodiment, the synthetic rubber may include a material based on nitrile or acryl, for example. In such an embodiment, the synthetic resin may include a thermoplastic elastomer based on polyolefin or polyester and an ethylene-vinyl acetate copolymer. In such an embodiment, the synthetic resin may include a material having rubber elasticity such as polyurethane or polybutadiene or soft polyvinyl chloride. In addition, the synthetic resin may include a compound of a material having rubber elasticity, such as polyurethane or polybutadiene or soft polyvinyl chloride, combined with at least one compounding agent of a hard polymer, a plasticizer and a softener.

The elastic element 420 of the second pressure sensing portion 402 and the elastic element 430 of the third pressure sensing portion 403 may include a material substantially the same as a material included in the elastic element 410 of the first pressure sensing portion 401.

The panel driver 306 controls operation of the display panel 303 based on the pressure sensing signal from the first pressure sensing portion 401, the pressure sensing signal from the second pressure sensing portion 402, and the pressure sensing signal from the third pressure sensing portion 403. In one exemplary embodiment, for example, the panel driver 306 may display a warning message, a warning symbol, or the like in the display area 303a of the display panel 303 according to the pressure sensing signal from the third pressure sensing portion 403. In such an embodiment, when the display panel 303 is pressed or folded with a force larger than a predetermined force, the panel driver 306 may display a warning message or warning symbol to effectively prevent the display panel 303 from being damaged.

Figure 13:
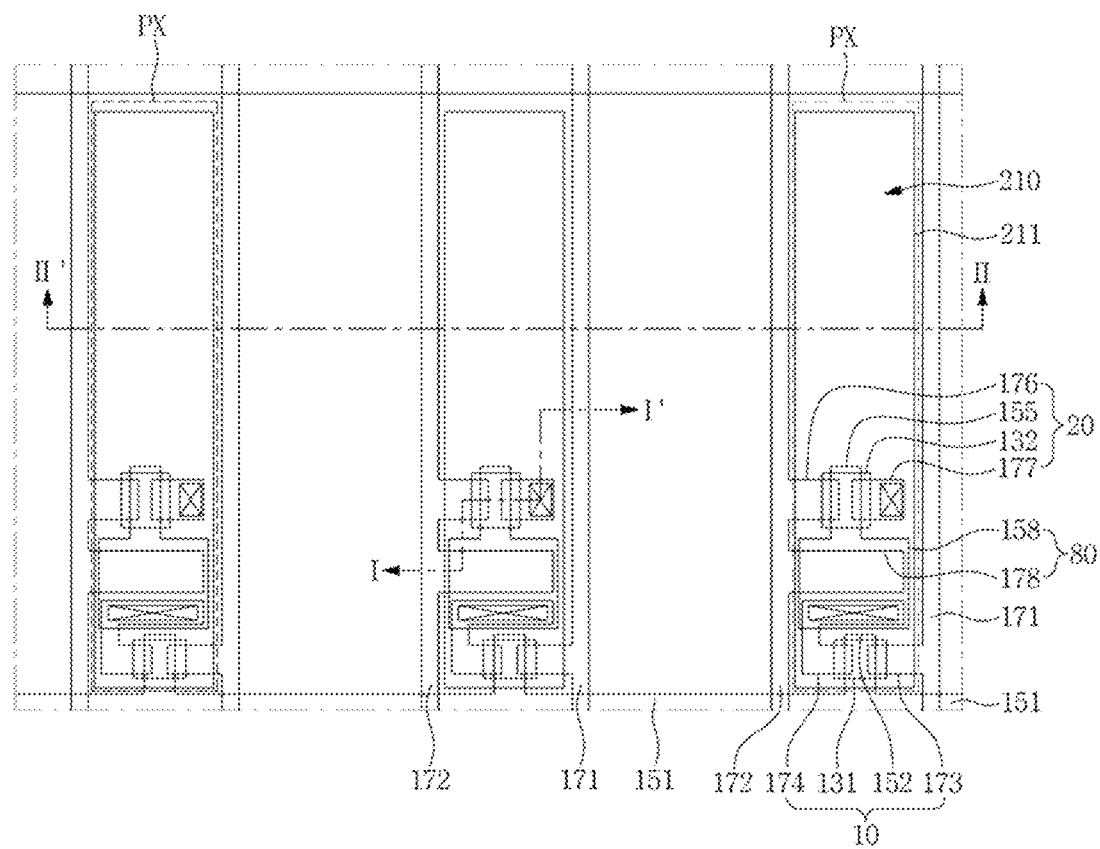
FIG. 13 is a view illustrating a portion of an exemplary embodiment of a display panel of FIG. 10.
Figure 14:
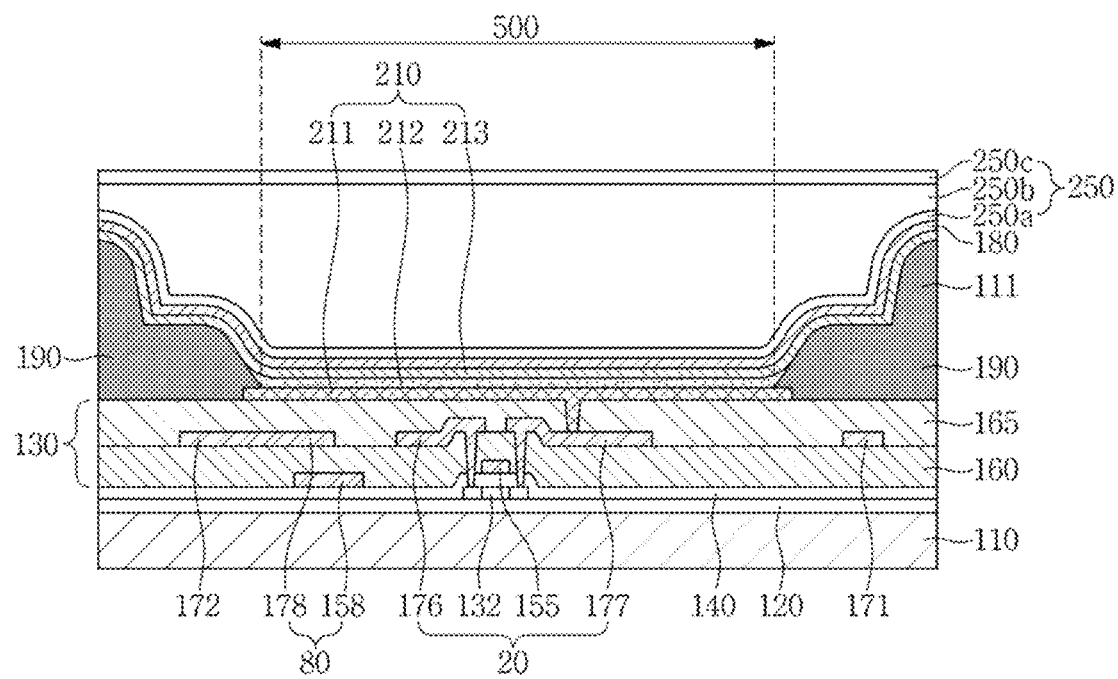
FIG. 14 is a cross-sectional view taken along line I-I' of FIG. 13.
Figure 15:
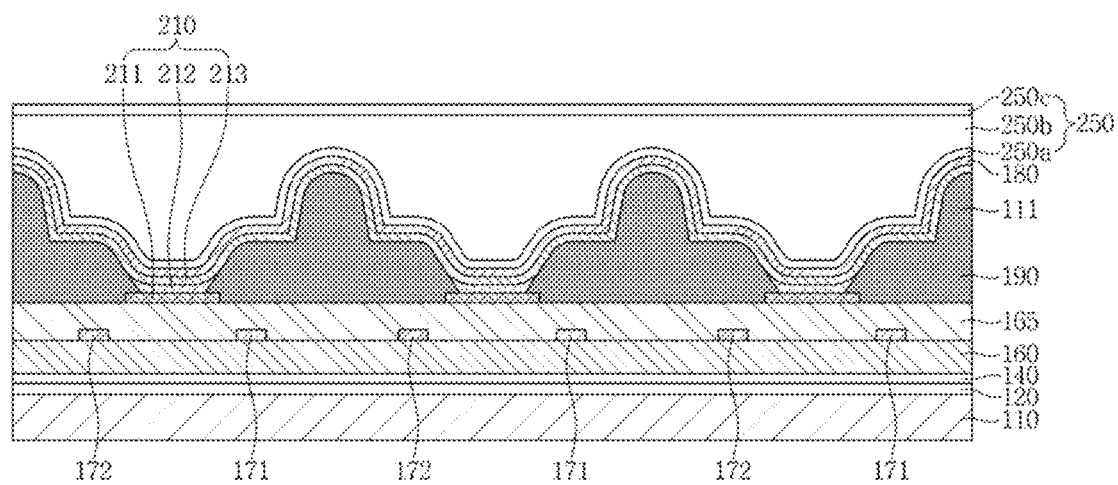
FIG. 15 is a cross-sectional view taken along line II-II' of FIG. 13.

FIG. 13 is a view illustrating a portion of an exemplary embodiment of a display panel of FIG. 10, FIG. 14 is a cross-sectional view taken along line I-I' of FIG. 13, and FIG. 15 is a cross-sectional view taken along line II-IP of FIG. 13.

Referring to FIGS. 13, 14 and 15, an exemplary embodiment of the display panel 303 includes a substrate 110, a driving circuit portion 130 on the substrate 110, an organic light emitting element 210 on the driving circuit portion 130, and a sealing member 250 on the organic light emitting element 210.

One pixel PX may be located at an area defined by a gate line 151, a data line 171 and a common power line 172.

In an exemplary embodiment, as illustrated in FIG. 13, adjacent pixels PX are spaced apart from each other by a predetermined distance. In one exemplary embodiment, for example, a distance between the common power line 172 connected to one pixel (hereinafter, a first pixel) and the data line 171 connected to another pixel adjacent to the first pixel (hereinafter, a second pixel) is longer than a distance between the data line 171 and the common power line 172 defining a location of the first pixel. In such an embodiment, a material used for the organic light emitting element 210 is effectively prevented from being infiltrated into the second pixel when the organic light emitting element 210 is deposited at the first pixel through a mask deposition process for manufacturing thereof.

The driving circuit portion 130 for driving the organic light emitting element 210 is disposed on the substrate 110. The driving circuit portion 130 includes a switching thin film transistor 10, a driving thin film transistor 20 and a capacitor 80. The driving circuit portion 130 drives a light emitting layer 212 of the organic light emitting element 210.

The specific structure of the driving circuit portion 130 and the organic light emitting element 210 of an exemplary embodiment of the display panel 303 is illustrated in FIGS. 14 and 15, but exemplary embodiments are not limited thereto. In such embodiment, the structure of the driving circuit portion 130 and the organic light emitting element 210 may be variously modified by those skilled in the art.

In an exemplary embodiment, as shown in FIG. 13, one pixel PX includes two thin film transistors (thin film transistors) and one capacitor, but exemplary embodiments are not limited thereto. Alternatively, one pixel PX may include three or more thin film transistors and two or more capacitors, and may further include a separate signal line to have various structures. Herein, the pixel PX refers to a minimum unit for displaying images and may be any one of a red pixel for emitting red light, a green pixel for emitting green light and a blue pixel for emitting blue light. In one exemplary embodiment, for example, as illustrated in FIG. 15, a pixel including the organic light emitting element 210 located at a leftmost side may be a red pixel, a pixel including the organic light emitting element 210 located at the center may be a green pixel, and a pixel including the organic light emitting element 210 located at a rightmost side may be a blue pixel. In such an embodiment, the leftmost organic light emitting element 210 may be a red organic light emitting element, the center organic light emitting element may be a green organic light emitting element and the rightmost organic light emitting element may be a blue organic light emitting element.

Referring to FIGS. 13 and 14, one pixel PX includes the switching thin film transistor 10, the driving thin film transistor 20, the capacitor 80 and the organic light emitting element 210. Herein, the structure including the switching thin film transistor 10, the driving thin film transistor 20 and the capacitor 80 is referred to as the driving circuit portion 130.

The driving circuit portion 130 includes the gate line 151 disposed along one direction and the data line 171 and the common power line 172 insulated from and intersecting the gate line 151.

The substrate 110 may be a transparent insulating substrate 110 including a glass or a transparent plastic. In one exemplary embodiment, for example, the substrate 110 may include at least one of kapton, polyethersulphone ("PES"), PC, PI, polyethyleneterephthalate (PET), PEN, polyacrylate ("PAR"), fiber reinforced plastic ("FRP") and the like.

A first buffer layer 120 may be disposed on the substrate 110. The first buffer layer 120 serves to substantially prevent permeation of undesirable elements and to planarize a surface therebelow, and may include a material suitable for planarizing and/or substantially preventing permeation. In one exemplary embodiment, for example, the first buffer layer 120 may include at least one of a silicon nitride ($SiN_x$) layer, a silicon oxide ($SiO_2$) layer and a silicon oxynitride ($SiO_xN_y$) layer. However, the first buffer layer 120 may be selectively provided, and may be omitted depending on the kinds of the substrate 110 and process conditions thereof.

As shown in FIGS. 13 and 14, a switching semiconductor layer 131 and a driving semiconductor layer 132 are disposed on the first buffer layer 120. The switching semiconductor layer 131 and the driving semiconductor layer 132 may include at least one of a polycrystalline silicon layer, an amorphous silicon layer and an oxide semiconductor such as indium gallium zinc oxide ("IGZO") and indium zinc tin oxide ("IZTO"). In one exemplary embodiment, for example, where the driving semiconductor layer 132 includes a polycrystalline silicon layer, the driving semiconductor layer 132 includes a channel area which is not doped with impurities and p+ doped source and drain areas which are formed on opposite sides of the channel area. In such an embodiment, p-type impurities, such as boron (B), may be used as dopant ions and $B_2H_6$ is typically used. Such impurities may vary depending on the kinds of thin film transistors.

In an exemplary embodiment, the driving thin film transistor 20 employs a p-channel metal oxide semiconductor ("PMOS") thin film transistor including p-type impurities, but exemplary embodiments are not limited thereto. Alternatively, the driving thin film transistor 20 may employ an n-channel metal oxide semiconductor ("NMOS") thin film transistor or a complementary metal oxide semiconductor ("CMOS") thin film transistor.

A gate insulating layer 140 is disposed on the switching semiconductor layer 131 and the driving semiconductor layer 132. The gate insulating layer 140 may include at least one of: tetraethylorthosilicate ("TEOS"), silicon nitride ($SiN_x$) and silicon oxide ($SiO_2$). In one exemplary embodiment, for example, the gate insulating layer 140 may have a double-layer structure where a $SiN_x$ layer having a thickness of about 40 nanometers (nm) and a TEOS layer having a thickness of about 80 nm are sequentially stacked.

A gate transmission line which includes gate electrodes 152 and 155 is disposed on the gate insulating layer 140. The gate transmission line further includes the gate line 151, a first capacitor plate 158 and other signal lines. In such an embodiment, the gate electrodes 152 and 155 are disposed to overlap at least a portion of or the entirety of the semiconductor layers 131 and 132, e.g., a channel area thereof. The gate electrodes 152 and 155 serve to substantially prevent the channel area from being doped with impurities when a source area and a drain area of the semiconductor layers 131 and 132 are doped with impurities during the process of forming the semiconductor layers 131 and 132.

The gate electrodes 152 and 155 and the first capacitor plate 158 are disposed on a substantially same layer and include a substantially same metal material. The gate electrodes 152 and 155 and the first capacitor plate 158 may include at least one of molybdenum (Mo), chromium (Cr) and tungsten (W).

An insulating interlayer 160 is disposed on the gate insulating layer 140 so as to cover the gate electrodes 152 and 155. The insulating interlayer 160, similar to the gate insulating layer 140, may include or include silicon nitride (SiNx), silicon oxide (SiOx), TEOS, or the like, but exemplary embodiments are not limited thereto.

A data transmission line which includes source electrodes 173 and 176 and drain electrodes 174 and 177 is disposed on the insulating interlayer 160. The data transmission line further includes the data line 171, the common power line 172, a second capacitor plate 178 and other wirings. In such an embodiment, the source electrodes 173 and 176 and the drain electrodes 174 and 177 are connected to the source area and the drain area of the semiconductor layers 131 and 132, respectively, through a contact hole defined at the gate insulating layer 140 and the insulating interlayer 160.

In an exemplary embodiment, as described above, the switching thin film transistor 10 includes the switching semiconductor layer 131, the switching gate electrode 152, the switching source electrode 173 and the switching drain electrode 174, and the driving thin film transistor 20 includes the driving semiconductor layer 132, the driving gate electrode 155, the driving source electrode 176 and the driving drain electrode 177. However, configurations of the thin film transistors 10 and 20 are not limited thereto, and thus may be modified into various structures that are easily conceived by those skilled in the pertinent art.

In an exemplary embodiment, the capacitor 80 includes the first capacitor plate 158 and the second capacitor plate 178 with the insulating interlayer 160 interposed therebetween.

The switching thin film transistor 10 may function as a switching element to select (or selectively turn on) pixels to perform light emission. The switching gate electrode 152 is connected to the gate line 151. The switching source electrode 173 is connected to the data line 171. The switching drain electrode 174 is spaced apart from the switching source electrode 173 and is connected to the first capacitor plate 158.

The driving thin film transistor 20 applies, to a pixel electrode 211, a driving power which allows a light emitting layer 212 of an organic light emitting element 210 in the selected (or turned-on) pixel to emit light. The driving gate electrode 155 is connected to the first capacitor plate 158. Each of the driving source electrode 176 and the second capacitor plate 178 is connected to the common power line 172. The driving drain electrode 177 is connected to the pixel electrode 211 of the organic light emitting element 210 through a contact hole.

Accordingly, in such an embodiment, the switching thin film transistor 10 is driven by a gate voltage applied to the gate line 151 and serves to transmit a data voltage applied to the data line 171 to the driving thin film transistor 20. A voltage equivalent to a difference between a common voltage applied to the driving thin film transistor 20 from the common power line 172 and the data voltage transmitted from the switching thin film transistor 10 is stored in the capacitor 80 and a current corresponding to the voltage stored in the capacitor 80 flows to the organic light emitting element 210 through the driving thin film transistor 20, such that the organic light emitting element 210 may emit light.

A planarization layer 165 is disposed to cover the data transmission line, e.g., the data line 171, the common power line 172, the source electrodes 173 and 176, the drain electrodes 174 and 177 and the second capacitor plate 178, which are patterned using a single mask during a manufacturing process thereof.

The planarization layer 165 serves to substantially eliminate a step difference and planarize a surface therebelow to increase luminous efficiency of the organic light emitting element 210 disposed thereon. The planarization layer 165 may include at least one of a PAR resin, an epoxy resin, a phenolic resin, a PA resin, a PI resin, an unsaturated polyester resin, a polyphenylen ether resin, a polyphenylene sulfide resin and benzocyclobutene ("BCB").

The pixel electrode 211 of the organic light emitting element 210 is disposed on the planarization layer 165. The pixel electrode 211 is connected to the drain electrode 177 through a contact hole defined in the planarization layer 165.

A part or all of the pixel electrode 211 is disposed in a pixel area 500. That is, the pixel electrode 211 is disposed to correspond to the pixel area 500 defined by a pixel defining layer 190. The pixel defining layer 190 may include a resin such as a PAR resin and a PI resin.

A first spacer 111 is disposed on the pixel defining layer 190. The first spacer 111 may include a material substantially the same as a material included in the pixel defining layer 190. The first spacer 111 serves to substantially minimize a height difference between a layer positioned at the display area 303a of the display panel 303 and a layer positioned at the non-display area 303b of the display panel 303. The first spacer 111 may be positioned corresponding to the third pressure sensing portion 403.

The light emitting layer 212 is disposed on the pixel electrode 211 in the pixel area 500, and a common electrode 213 is disposed on the pixel defining layer 190, the first spacer 111 and the light emitting layer 212.

The light emitting layer 212 includes a low molecular organic material or a high molecular organic material. At least one of a hole injection layer and a hole transport layer may further be disposed between the pixel electrode 211 and the light emitting layer 212 and at least one of an electron transport layer and an electron injection layer may further be disposed between the light emitting layer 212 and the common electrode 213.

The pixel electrode 211 and the common electrode 213 may be one of a transmissive electrode, a transflective electrode and a reflective electrode.

A transparent conductive oxide ("TCO") may be used to form a transmissive electrode. Such TCO may include at least one of indium tin oxide ("ITO"), indium zinc oxide ("IZO"), antimony tin oxide ("ATO"), aluminum zinc oxide ("AZO"), zinc oxide (ZnO), and a combination thereof.

In an exemplary embodiment, a metal, e.g., magnesium (Mg), silver (Ag), gold (Au), calcium (Ca), lithium (Li), chromium (Cr), aluminum (Al) and copper (Cu), or an alloy thereof, may be used to form a transflective electrode and a reflective electrode. In such an embodiment, whether an electrode is a transflective type or a reflective type depends on the thickness of the electrode. Typically, the transflective electrode has a thickness of about 200 nm, or less and the reflective electrode has a thickness of about 300 nm or greater. As the thickness of the transflective electrode decreases, light transmittance and resistance increase. On the contrary, as the thickness of the transflective electrode increases, light transmittance decreases.

In such an embodiment, the transflective electrode and the reflective electrode may have a multilayer structure which includes a metal layer including a metal or a metal alloy and a TCO layer stacked on the metal layer.

In an exemplary embodiment, the pixel PX may have a double-sided emission type structure capable of emitting light in the direction of the pixel electrode 211 and the common electrode 213. In such an embodiment, both the pixel electrode 211 and the common electrode 213 may be a transmissive or transflective electrode.

The sealing member 250 is disposed on the common electrode 213. A transparent insulating substrate 110 including a glass, a transparent plastic, or the like may be used as the sealing member 250. In such an embodiment, the sealing member 250 may have a thin film encapsulation structure in which one or more inorganic layers and one or more organic layers are alternately laminated one on another. In one exemplary embodiment, for example, as illustrated in FIGS. 14 and 15, the sealing member 250 may include a first inorganic layer 250a, an organic layer 250b on the first inorganic layer 250a and a second inorganic layer 250c on the organic layer 250b.

In an exemplary embodiment, as illustrated in FIGS. 14 and 15, a capping layer 180 may further be disposed between the sealing member 250 and the common electrode 213. The capping layer 180 serves to substantially prevent damage to the common electrode 213 located below the sealing member 250 when the sealing member 250 is deposited. The capping layer 180 may include an inorganic material.

FIG. 16 is a view showing an impact resistance test of a window.

The impact resistance test of the window includes a ball drop test, in which three specimens 600A, 600B, 600C and a spherical iron ball 900 are prepared. The iron ball 900 may have a mass of, for example, about 0.13 kilogram (Kg).

A Y-axis coordinate in FIG. 16 means a drop height of the iron ball 900.

The first specimen 600A includes a stainless steel plate 951, an aluminum foil 955, a base layer 601 and a first hard coating layer 611.

A thickness of the first hard coating layer 611 of the first specimen 600A is about 20 µm.

The second specimen 600B includes a stainless steel plate 951, an aluminum foil 955, a base layer 601, a first hard coating layer 611 and a second hard coating layer 612.

A thickness of the first hard coating layer 611 of the second specimen 600B is about 20 µm and a thickness of the second hard coating layer 612 of the second specimen 600B is about 15 µm.

The third specimen 600C includes a stainless steel plate 951, an aluminum foil 955, a light blocking member 355, a transparent tape 356, a base layer 601, a first hard coating layer 611 and a second hard coating layer 612.

A thickness of the first hard coating layer 611 of the third specimen 600C is about 20 µm, and a thickness of the second hard coating layer 612 of the third specimen 600C is about 15 µm.

For the ball drop test of the first specimen 600A, the iron ball 900 falls from above the first specimen 600A toward the first hard coating layer 611 of the first specimen 600A. The drop height of the iron ball 900 is about 20 centimeters (cm) for the first drop. The drop height means a distance between the iron ball 900 and the first hard coating layer 611 of the first specimen 600A.

The ball drop test for the first specimen 600A is performed several times and the drop height gradually increases as the repetition progresses.

When the iron ball 900 hits the first hard coating layer 611 of the first specimen 600A, a first drop height at which a visually recognizable mark appears on the aluminum foil 955 of the first specimen 600A is measured. More particularly, in the ball drop test for the first specimen 600A, the first drop height at which a visually recognizable mark appears on the aluminum foil 955 of the first specimen 600A is about 60 cm.

Similarly, for the ball drop test of the second specimen 600B, the iron ball 900 falls from above the second specimen 600B toward the second hard coating layer 612 of the second specimen 600B. The drop height of the iron ball 900 is about 20 cm for the first time. The drop height means a distance between the iron ball 900 and the second hard coating layer 612 of the second specimen 600B.

The ball drop test for the second specimen 600B is performed several times and the drop height gradually increases as the repetition progresses.

When the iron ball 900 hits the second hard coating layer 612 of the second specimen 600B, a first drop height at which a visually recognizable mark appears on the aluminum foil 955 of the second specimen 600B is measured. More particularly, in the ball drop test for the second specimen 600B, the first drop height at which a visually recognizable mark appears on the aluminum foil 955 of the second specimen 600B is about 50 cm.

Similarly, for the ball drop test of the third specimen 600C, the iron ball 900 falls from above the third specimen 600C toward the second hard coating layer 612 of the third specimen 600C. The drop height of the iron ball 900 is about 20 cm for the first time. The drop height means a distance between the iron ball 900 and the second hard coating layer 612 of the third specimen 600C.

The ball drop test for the third specimen 600C is performed several times and the drop height gradually increases as the repetition progresses.

When the iron ball 900 of the third specimen 600C hits the second hard coating layer 612, a first drop height at which a visually recognizable mark appears on the aluminum foil 955 of the third specimen 600C is measured. More particularly, in the ball drop test for the third specimen 600C, the first drop height at which a visually recognizable mark appears on the aluminum foil 955 of the third specimen 600C is about 45 cm.

As described above, the higher the first drop height, the better the impact resistance of the specimen.

As described above with reference to FIG. 16, the specimens 600A, 600B and 600C having the structure of the window according to an exemplary embodiment have high impact resistance.

In exemplary embodiments of a display device set forth herein, impact resistance, hardness or heat resistance of a window may be improved. In such embodiments, warping or curling of the window may be substantially minimized.

In such embodiments, a sensing error of the display device may be substantially minimized, and the thickness of the display device may be reduced since pressure sensing portions include elastic elements having different thicknesses from each other.

In such embodiments, the display device may detect an occurrence of a strong pressure touch (e.g., a touch with a pressure greater than a predetermined reference pressure) to display a warning message on a display panel. Accordingly, damage to the display device may be substantially prevented.

While the invention has been illustrated and described with reference to the exemplary embodiments thereof, it will be apparent to those of ordinary skill in the art that various changes in form and detail may be formed thereto without departing from the spirit and scope of the invention.

What is claimed is:

1. A window for a display device comprising:
   a base layer;
   a first hard coating layer on the base layer; and
   a second hard coating layer on the first hard coating layer and having a thickness less than a thickness of the first hard coating layer, wherein the first hard coating layer is between the base layer and the second hard coating layer,
   wherein the first hard coating layer comprises acryl and epoxy, a ratio between the acryl and the epoxy of the first hard coating layer being 7:3.

2. The window of claim 1, wherein the first hard coating layer has a thickness in a range from about 5% to about 10% of a thickness of the base layer.

3. The window of claim 1, further comprising at least one of:
   a first auxiliary layer on a lower surface of the base layer; and
   a second auxiliary layer between the base layer and the first hard coating layer.

4. The window of claim 3, wherein at least one of the first auxiliary layer and the second auxiliary layer comprises at least one of polyimide, polycarbonate, polyethersulfone, polyethylene naphthalate, polyphenylene sulfide, opaque liquid crystal polymer and polymethylmethacrylate.

5. The window of claim 1, wherein the second hard coating layer comprises acrylic oligomer.

6. The window of claim 1, wherein at least one of the base layer, the first hard coating layer and the second hard coating layer comprises fluorine.

7. The window of claim 1, wherein the base layer comprises at least one of polycarbonate, a low birefringence resin and poly methyl methacrylate.

8. The window of claim 1, wherein the first hard coating layer has a multilayer structure.

9. The window of claim 1, wherein the base layer comprises a soft layer and a hard layer.

10. The window of claim 9, wherein the soft layer and the hard layer are alternately arranged with each other.

11. The window of claim 1, wherein the second hard coating layer has a thickness which is about 10% of the thickness of the first hard coating layer.

12. A display device comprising:
    a display panel; and
    a window on the display panel,
    wherein the window comprises:
       a base layer on the display panel;
       a first hard coating layer on the base layer; and
       a second hard coating layer on the first hard coating layer and having a thickness less than a thickness of the first hard coating layer, wherein the first hard coating layer is between the base layer and the second hard coating layer,
    wherein the first hard coating layer comprises acryl and epoxy, a ratio between the actyl and epoxy of the first hard coating layer being 7:3.

13. The display device of claim 12, wherein the first hard coating layer has a thickness in a range from about 5% to about 10% of a thickness of the base layer.

14. The display device of claim 12, wherein the window further comprises at least one of:
    a first auxiliary layer between the display panel and the base layer; and
    a second auxiliary layer between the base layer and the first hard coating layer.

15. The display device of claim 14, wherein at least one of the first auxiliary layer and the second auxiliary layer comprises at least one of polyimide, polycarbonate, polyethersulfone, polyethylene naphthalate, polyphenylene sulfide, opaque liquid crystal polymer and polymethylmethacrylate.

16. The display device of claim 12, wherein the second hard coating layer comprises acrylic oligomer.

17. The display device of claim 12, wherein at least one of the base layer, the first hard coating layer and the second hard coating layer comprises fluorine.

18. A display device comprising:
    a display panel; and
    a window on the display panel,
    wherein the window comprises:
       a base layer on the display panel;
       a first hard coating layer on the base layer;
       a second hard coating layer on the first hard coating layer and having a thickness less than a thickness of the first hard coating layer, the first hard coating layer being between the base layer and the second hard coating layer;
    a frame which supports the window;
    a panel support portion between the window and a base portion of the frame; and
    a first pressure sensing portion between the panel support portion and the display panel.

19. The display device of claim 18, wherein the display panel comprises:
    a center portion between the panel support portion and the window; and
    an edge portion between the panel support portion and the base portion of the frame,
    wherein the first pressure sensing portion is disposed between the edge portion and the panel support portion.

20. The display device of claim 19, further comprising at least one of:
    a second pressure sensing portion between a side portion protruding from an edge of the frame and an edge of the window; and
    a third pressure sensing portion between the window and the display panel,
    wherein the display panel is flexible.

21. The display device of claim 20, wherein at least two of the first, second and third pressure sensing portions have different sensitivities from each other.

22. The display device of claim 21, wherein
    the third pressure sensing portion has a lowest sensitivity,
    the second pressure sensing portion has a highest sensitivity, and
    the first pressure sensing portion has a sensitivity lower than the sensitivity of the second pressure sensing portion and higher than the sensitivity of the third pressure sensing portion.

23. The display device of claim 20, wherein at least two of the first, second and third pressure sensing portions comprise elastic elements having different moduli from each other.

24. The display device of claim 23, wherein
each of the first pressure sensing portion, the second pressure sensing portion and the third pressure sensing portion comprises an elastic element,
a modulus of the elastic element of the third pressure sensing portion is greater than a modulus of the elastic element of the first pressure sensing portion, and
the modulus of the elastic element of the first pressure sensing portion is greater than a modulus of the elastic element of the second pressure sensing portion.

25. The display device of claim 23, wherein
the elastic element of the first pressure sensing portion has a thickness substantially equal to or greater than a thickness of the elastic element of the second pressure sensing portion, and
the elastic element of the third pressure sensing portion has a thickness less than a thickness of the elastic element of the first pressure sensing portion.

26. A method of manufacturing a window for a display device, the method comprising:
providing a first hard coating layer on a base layer; and
providing a second hard coating layer on the first hard coating layer,
wherein the second hard coating layer has a thickness less than a thickness of the first hard coating layer,
wherein the first hard coating layer comprises acryl and epoxy, a ration between the acryl and epoxy of the first hard coating layer being 7:3.

27. The method of claim 26, wherein the first hard coating layer has a thickness which is in a range from about 5% to about 10% of a thickness of the base layer.

28. The method of claim 26, further comprising at least one of:
providing a first auxiliary layer on a lower surface of the base layer; and
providing a second auxiliary layer between the base layer and the first hard coating layer.

29. The method of claim 28, wherein at least one of the first auxiliary layer and the second auxiliary layer comprises at least one of polyimide, polycarbonate, polyethersulfone, polyethylene naphthalate, polyphenylene sulfide, and opaque liquid crystal polymer.

30. The method of claim 26, wherein the providing the first hard coating layer comprises:
forming a first layer on the base layer;
half-curing the first layer;
forming a second layer on the half-cured first layer; and
fully curing the first layer and the second layer.

* * * * *